US012719413B2

(12) United States Patent
Chao et al.

(10) Patent No.: US 12,719,413 B2
(45) Date of Patent: Aug. 25, 2026

(54) REDUCTION OF CHARGE INJECTION NOISE IN SENSE AMPLIFIERS OF HIGH-SPEED DATA INTERFACES

(71) Applicant: PARADE TECHNOLOGIES, LTD, San Jose, CA (US)

(72) Inventors: Chieh-Yuan Chao, Fremont, CA (US); Jenghung Tsai, Santa Clara, CA (US)

(73) Assignee: PARADE TECHNOLOGIES, LTD, San Jose, CA (US)

( * ) Notice: Subject to any disclaimer, the term of this patent is extended or adjusted under 35 U.S.C. 154(b) by 584 days.

(21) Appl. No.: 18/182,992

(22) Filed: Mar. 13, 2023

(65) Prior Publication Data

US 2024/0313708 A1 Sep. 19, 2024

(51) Int. Cl.

| | |
|---|---|
| ***H03F 1/26*** | (2006.01) |
| ***H03F 3/45*** | (2006.01) |
| ***H04B 15/00*** | (2006.01) |
| ***H04L 25/08*** | (2006.01) |
| ***H04L 25/49*** | (2006.01) |

(52) U.S. Cl.

CPC ........... *H03F 1/26* (2013.01); *H03F 3/45183* (2013.01); *H04B 15/005* (2013.01); *H04L 25/08* (2013.01); *H04L 25/4917* (2013.01)

(58) Field of Classification Search

CPC ..... H03F 1/26; H03F 3/45183; H04B 15/005; H04L 25/08; H04L 25/4917; G11C 7/065; G11C 7/08; G11C 11/4091; G11C 11/419

USPC .......................................................... 330/253

See application file for complete search history.

(56) References Cited

U.S. PATENT DOCUMENTS

| | | | | |
|---|---|---|---|---|
| 9,922,688 | B2 * | 3/2018 | Weier | H03K 19/20 |
| 2008/0079492 | A1 * | 4/2008 | Kobayashi | H03F 3/45475 330/261 |
| 2015/0311875 | A1 * | 10/2015 | Chen | G11C 7/065 327/52 |
| 2019/0074800 | A1 * | 3/2019 | Wu | H03F 1/483 |

* cited by examiner

*Primary Examiner* — Andrea Lindgren Baltzell
*Assistant Examiner* — Jose E Pinero
(74) *Attorney, Agent, or Firm* — Morgan, Lewis & Bockius LLP

(57) ABSTRACT

An electronic device includes a sense amplifier. The sense amplifier includes a pair of load transistors cross-coupled to each other, a pair of input transistors coupled to the pair of load transistors, a first current path, and a second current path. The pair of input transistors is configured to receive a pair of input signals and enable generation of a pair of output signals from the pair of input signals during a duty cycle of a clock signal. The first current path is coupled to the pair of input transistors via a tail node and controlled by the clock signal to couple the tail node to a power supply and enable generation of the pair of output signals during the duty cycle of the clock signal. A second current path electrically couples the tail node to the power supply, independently of switching of the clock signal.

20 Claims, 13 Drawing Sheets

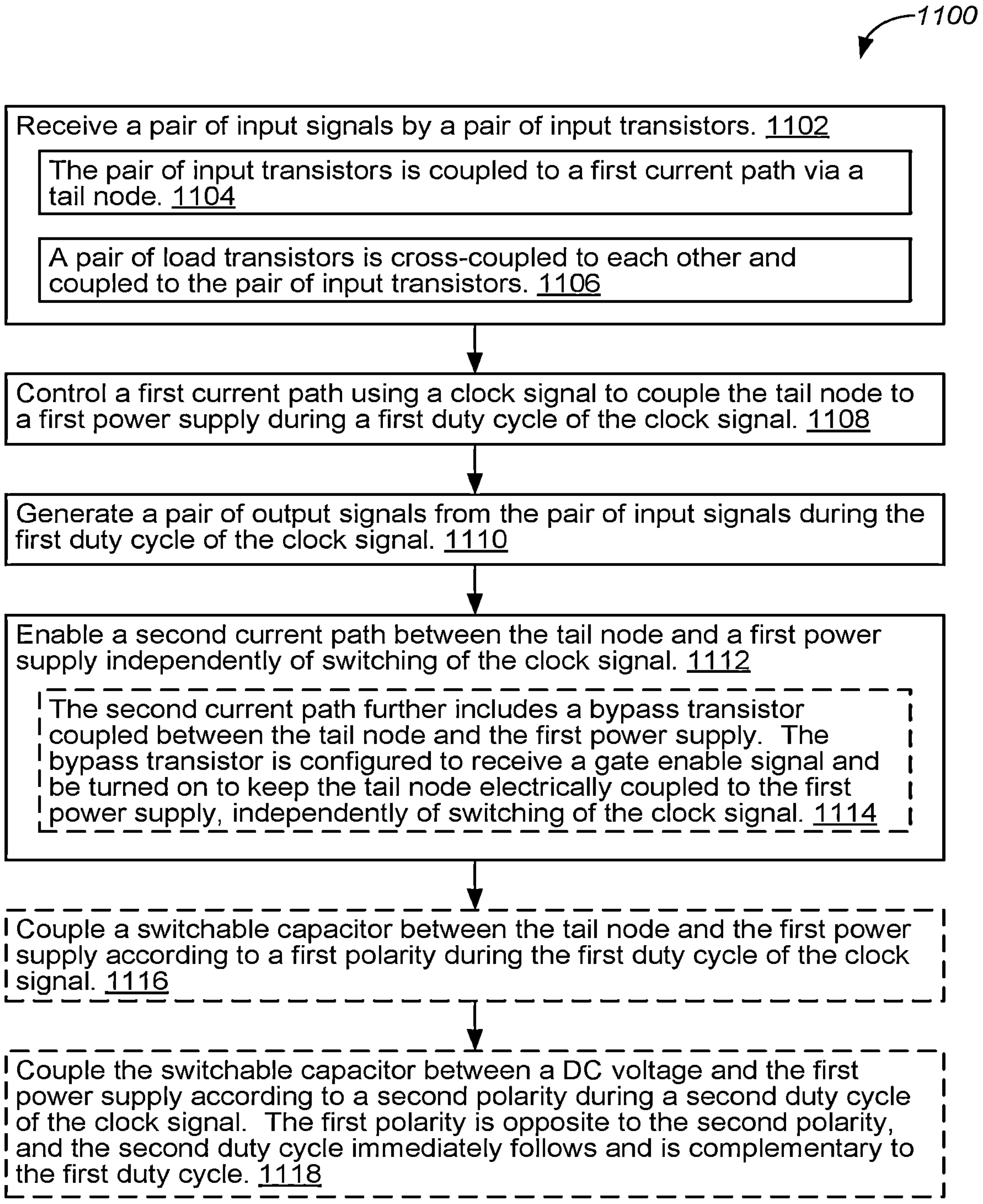

Figure 11

Receive a pair of input signals by a pair of input transistors. 1102

The pair of input transistors is coupled to a first current path via a tail node. 1104

A pair of load transistors is cross-coupled to each other and coupled to the pair of input transistors. 1106

Control a first current path using a clock signal to couple the tail node to a first power supply during a first duty cycle of the clock signal. 1108

Generate a pair of output signals from the pair of input signals during the first duty cycle of the clock signal. 1110

Enable a second current path between the tail node and a first power supply independently of switching of the clock signal. 1112

The second current path further includes a bypass transistor coupled between the tail node and the first power supply. The bypass transistor is configured to receive a gate enable signal and be turned on to keep the tail node electrically coupled to the first power supply, independently of switching of the clock signal. 1114

Couple a switchable capacitor between the tail node and the first power supply according to a first polarity during the first duty cycle of the clock signal. 1116

Couple the switchable capacitor between a DC voltage and the first power supply according to a second polarity during a second duty cycle of the clock signal. The first polarity is opposite to the second polarity, and the second duty cycle immediately follows and is complementary to the first duty cycle. 1118

1200

Provide a pair of load transistors that are cross-coupled to each other. 1202

Provide a pair of input transistors coupled to the pair of load transistors. 1204

The pair of input transistors is configured to receive a pair of input signals and enable generation of a pair of output signals from the pair of input signals during a first duty cycle of a clock signal. 1206

Provide a pair of latch transistors. Each latch transistor is coupled in series between a respective first load transistor and a respective input transistor, and forms a complementary metal-oxide semiconductor (CMOS) inverter with the respective load transistor. 1222

Provide a pair of precharge transistors. Each precharge transistor is coupled to a respective load transistor and coupled between a second power supply and a respective output of the sense amplifier. The pair of precharge transistors is configured to precharge the pair of output signals to a supply voltage of the second power supply. 1224

Provide a first current path coupled to the pair of input transistors via a tail node. 1208

The first current path is configured to be controlled by the clock signal to couple the tail node to a first power supply and enable generation of the pair of output signals during the first duty cycle of the clock signal. 1210

Provide a second current path coupled to the tail node. 1212

The second current path is configured to electrically couple the tail node to the first power supply, independently of switching of the clock signal. 1214

The second current path further includes a bypass transistor coupled between the tail node and the first power supply. The bypass transistor is configured to receive a gate enable signal and be turned on to keep the tail node electrically coupled to the first power supply, independently of switching of the clock signal. 1216

Provide a switchable capacitor configured: (1) to be coupled between the tail node and the first power supply according to a first polarity during the first duty cycle of the clock signal and (2) to be coupled between a DC voltage and the first power supply according to a second polarity during a second duty cycle of the clock signal. 1218

The first polarity is opposite to the second polarity, and the second duty cycle immediately follows and is complementary to the first duty cycle. 1220

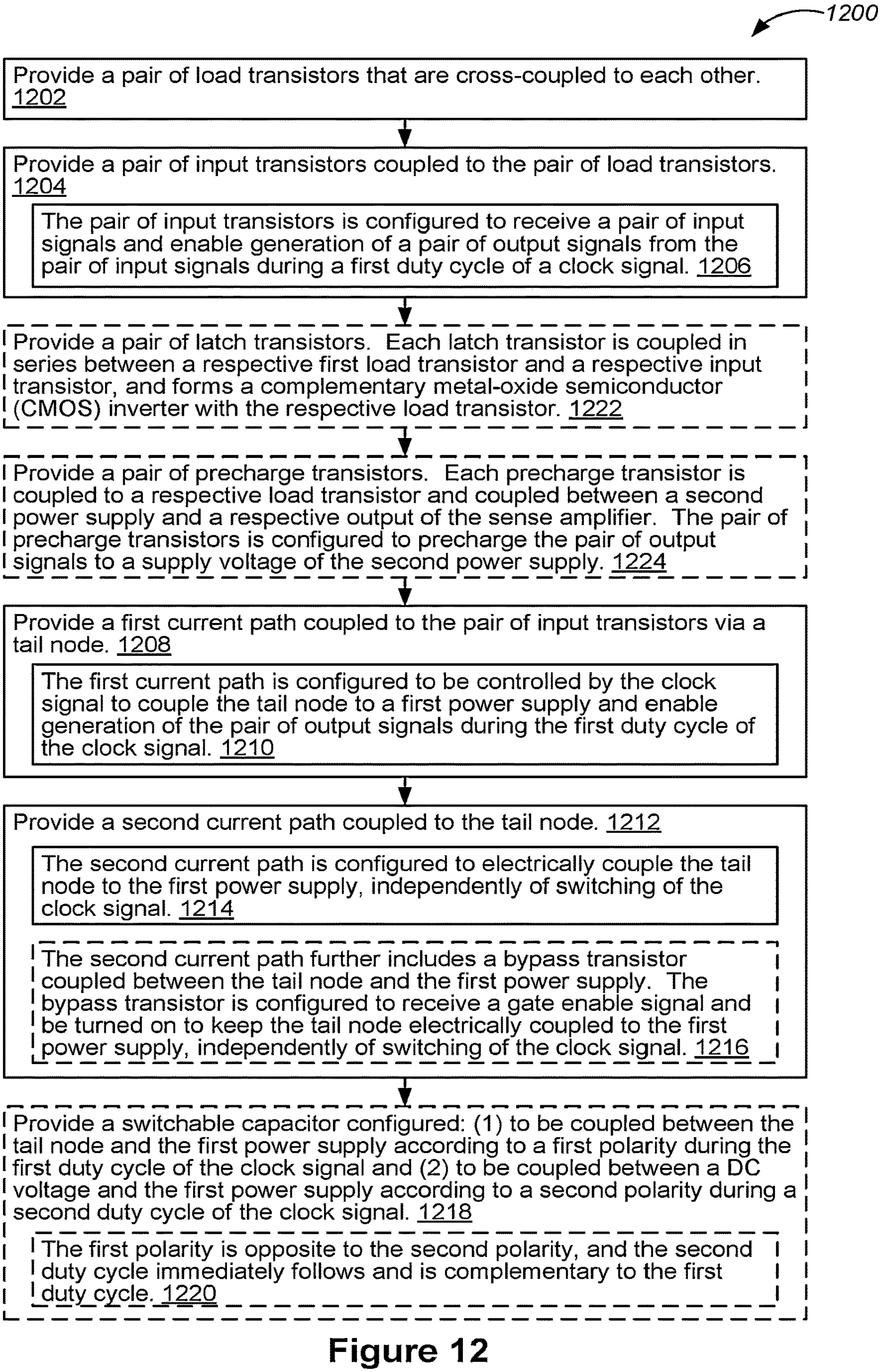

Figure 12

REDUCTION OF CHARGE INJECTION NOISE IN SENSE AMPLIFIERS OF HIGH-SPEED DATA INTERFACES

TECHNICAL FIELD

The disclosed embodiments relate generally to data transmission technology including, but not limited to, methods, systems, and devices for controlling noise in sense amplifiers of high-speed data interfaces in wired data communication paths.

BACKGROUND

Many electronic devices are physically coupled to and communicate with one another using data links and interfaces that comply with high-speed data communication protocols. These data communication protocols rely on high fidelity complementary signals to control data transmitted over the data links and interfaces. The complementary signals are latched at different phases of a clock signal by sense amplifiers (also called data slicers or level shifters). However, charges are injected into the complementary signals at the different phases of the clock signal, thereby compromising signal quality and overall performance of the data links and interfaces. It would be beneficial to provide an effective and efficient mechanism to control noise (particularly, charge injection noise) in a sense amplifier of a high-speed data interface in a wired data communication path.

SUMMARY

This application is directed to methods, electronic systems, electronic devices, electronic circuits, data links, data ports, and data interfaces that control noise (e.g., charge injection noise) in a sense amplifier of a high-speed data interface in a wired data communication path. In some embodiments, the data communication path complies with a high-speed data communication protocol (e.g., USB4 v1.0, USB4 v2.0, PAM-3 Gen 4, or PCIe Gen 4). A sense amplifier is also called a data slicer or a level shifter. A sense amplifier includes a strong-arm latch circuit that controls charge injection noise coupled into a differential input signal of the sense amplifier. The charge injection noise results from charge injections induced at rising or fall edges of clock signals. In some embodiments, a modulation circuit includes an additional current path applied to control voltage fluctuation of a common source node of a pair of input transistors during clock switching, and the charge injection noise is controlled for the differential input signal of the input transistors. Alternatively or additionally, in some embodiments, a modulation circuit includes a switchable capacitor applied to control the charge injection noise caused by charge injected during a latch phase. In a clock phase opposite to and prior to the latch phase, the switchable capacitor stores charges opposite to the charge injected during the latch phase. In the latch phase, this switchable capacitor releases the opposite charge previously stored in the opposite clock phase to compensate for the charges injected due to the clock switching, thereby effectively reducing the charge injection noise in the input differential signal of the sense amplifier.

In one aspect, an electronic device includes a sense amplifier. The sense amplifier includes a pair of load transistors that are cross-coupled to each other, a pair of input transistors coupled to the pair of load transistors, a first current path, and a second current path. The pair of input transistors is configured to receive a pair of input signals and enable generation of a pair of output signals from the pair of input signals during a first duty cycle of a clock signal. The first current path is coupled to the pair of input transistors via a tail node and controlled by the clock signal to couple the tail node to a first power supply and enable generation of the pair of output signals during the first duty cycle of the clock signal. The second current path is coupled to the tail node, and electrically couples the tail node to the first power supply, independently of switching of the clock signal.

In another aspect, a sense amplifier includes a pair of load transistors that are cross-coupled to each other, a pair of input transistors coupled to the pair of load transistors, a first current path, and a second current path. The pair of input transistors is configured to receive a pair of input signals and enable generation of a pair of output signals from the pair of input signals during a first duty cycle of a clock signal. The first current path is coupled to the pair of input transistors via a tail node and controlled by the clock signal to couple the tail node to a first power supply and enable generation of the pair of output signals during the first duty cycle of the clock signal. The second current path is coupled to the tail node, and electrically couples the tail node to the first power supply, independently of switching of the clock signal.

In some embodiments, the second current path further includes a bypass transistor coupled between the tail node and the first power supply. The bypass transistor is configured to receive a gate enable signal and be turned on to keep the tail node electrically coupled to the first power supply, independently of switching of the clock signal. Further, in some embodiments, the first current path further includes a control transistor having a gate coupled to the clock signal. The control transistor is coupled between the tail node and the first power supply and in parallel with the bypass transistor, and the size of the control transistor is greater than the size of the bypass transistor.

In some embodiments, the electronic device further includes a switchable capacitor. The switchable capacitor is configured: (1) to be coupled between the tail node and the first power supply according to a first polarity during the first duty cycle of the clock signal and (2) to be coupled between a DC voltage and the first power supply according to a second polarity during a second duty cycle of the clock signal. The first polarity is opposite to the second polarity, and the second duty cycle immediately follows and is complementary to the first duty cycle. Further, in some embodiments, the switchable capacitor includes a first electrode and a second electrode. During the first duty cycle of the clock signal, the first electrode is electrically coupled to the first power supply, and the second electrode is electrically coupled to the tail node. During the second duty cycle of the clock signal, the first electrode is electrically coupled to the DC voltage, and the second electrode is electrically coupled to the first power supply. In some embodiments, a first switch is coupled between a first electrode of the switchable capacitor and the first power supply, and a second switch is coupled between a second electrode of the switchable capacitor and the tail node. The third switch is coupled between the first electrode and the DC voltage, and a fourth switch is coupled between the second electrode and the first power supply. The first switch and the second switch are controlled by an inverse signal that is inverse to the clock signal to charge the switchable capacitor during the first duty cycle according to the first polarity. The third switch and the fourth switch are controlled by the clock signal to charge the switchable capacitor during the second duty cycle according to the second polarity.

In yet another aspect, a method is implemented for amplifying input signals in a high-speed wired communication link. The method includes receiving a pair of input signals by a pair of input transistors. The pair of input transistors is coupled to a first current path via a tail node, and a pair of load transistors is cross-coupled to each other and coupled to the pair of input transistors. The method further includes controlling a first current path using a clock signal to couple the tail node to a first power supply during a first duty cycle of the clock signal. The method further includes generating a pair of output signals from the pair of input signals during the first duty cycle of the clock signal and enabling a second current path between the tail node and a first power supply independently of switching of the clock signal.

In yet another aspect, a method is implemented to provide a sense amplifier. The method includes providing a pair of load transistors that are cross-coupled to each other and providing a pair of input transistors coupled to the pair of load transistors. The pair of input transistors is configured to receive a pair of input signals and enable generation of a pair of output signals from the pair of input signals during a first duty cycle of a clock signal. The method further includes providing a first current path coupled to the pair of input transistors via a tail node. The first current path is configured to be controlled by the clock signal to couple the tail node to a first power supply and enable generation of the pair of output signals during the first duty cycle of the clock signal. The method further includes providing a second current path coupled to the tail node. The second current path is configured to electrically couple the tail node to the first power supply, independently of switching of the clock signal.

These illustrative embodiments are mentioned not to limit or define the disclosure, but to provide examples to aid understanding thereof. Additional embodiments are discussed in the Description of Embodiments, and further description is provided there.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIG. 11 is a flow diagram of an example method for amplifying input signals in a high-speed wired communication link, in accordance with some embodiments.

FIG. 12 is a flow diagram of an example method for providing a sense amplifier in which a modulation circuit is applied to control injection current noise, in accordance with some embodiments.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
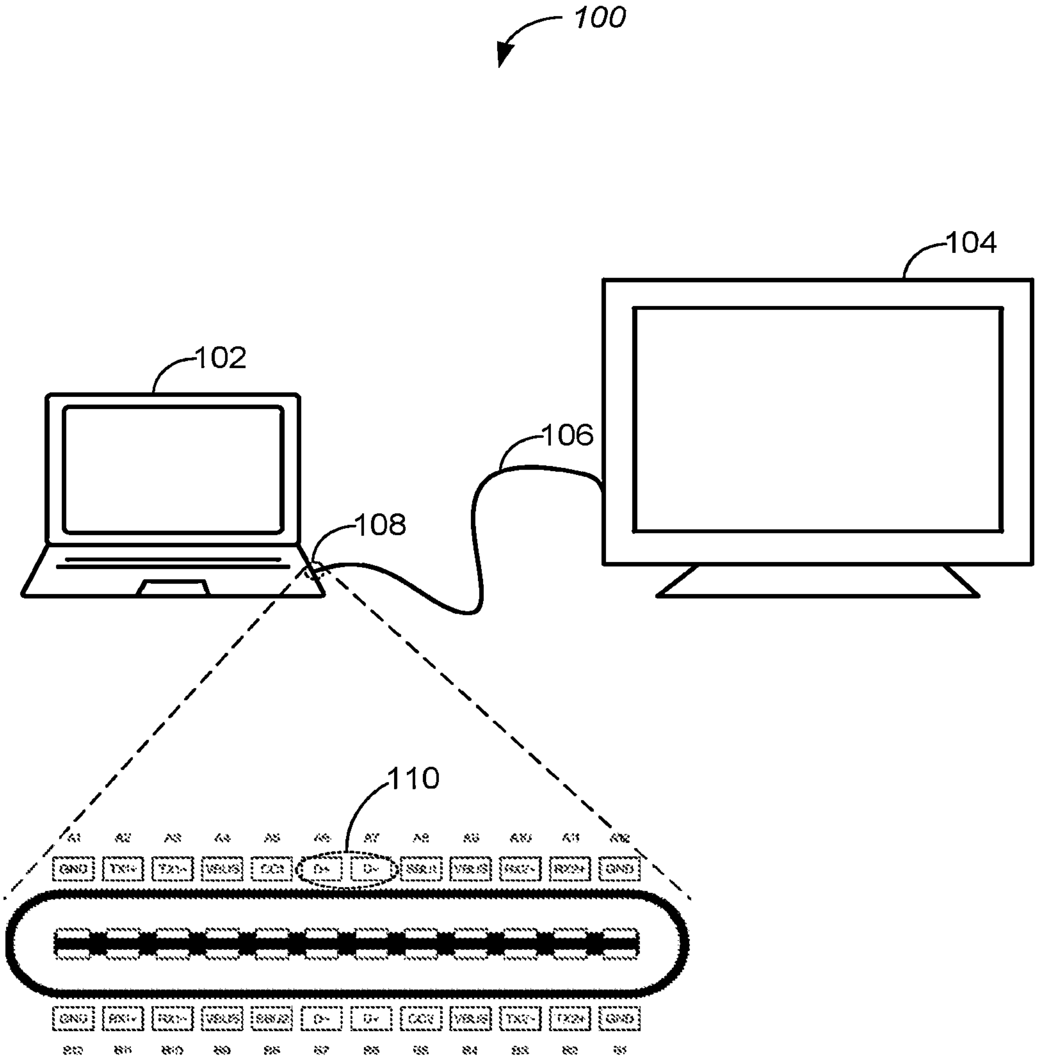
FIG. 1 is a block diagram of an example electronic system in which electronic devices are electrically via a data link, in accordance with some embodiments.

FIG. 1 is a block diagram of an example electronic system 100 in which a first electronic device 102 is electrically coupled to a second electronic device 104 via a data link 106, in accordance with some embodiments. The first electronic device 102 and second electronic device 104 are configured to exchange data via the data link 106. In an example, the first electronic device 102 includes a video source, and the second electronic device 104 includes a display device. The display device has a screen configured to display visual content provided by the first electronic device 102 via the data link 106. In another example not shown, the first electronic device 102 includes a desktop computer, and the second electronic device 104 includes a mobile phone that exchanges data with the desktop computer via the data link 106. Examples of the electronic devices 102 and 104 include, but are not limited to, a desktop computer, a laptop computer, a tablet computer, a video player, a camera device, a gameplayer device, or other formats of electronic devices that are configured to provide data or receive data. Video data, audio data, text, program data, control data, configuration data, or any other data are transmitted between the first and second electronic devices 102 and 104 via the data link 106.

The data link 106 includes a connector 108 at each of two ends. The two connectors 108 are configured to connect the data link 106 to respective connectors 108 of the first electronic device 102 and second electronic device 104. For example, the connector 108 is a DisplayPort connector having a digital display interface developed by a consortium of personal computer and chip manufacturers and standardized by the Video Electronics Standards Association (VESA). The DisplayPort connector is configured to connect the data link 106 to the first electronic device 102 and carry video, audio, and control data according to a data communication protocol. In another example, the connector 108 is a universal serial bus (USB) connector (e.g., configured to connect a computer to a peripheral device). Exemplary types of the USB connector include, but are not limited to, USB-A, USB-B, USB-C, USB Micro-A, USB Micro-B, USB Mini-B, USB 3.0A, USB 3.0B, USB 3.0 Micro B, and USB Micro-AB. Further, a data communication protocol of USB4 is applied to communicate data using a USB-C connector, thereby providing a throughput of up to 40 Gbps, power delivery of up to 100 W, support for 4K and 5K displays, and backward compatibility with USB 3.2 and USB 2.

In some embodiments, the connector 108 includes a bidirectional channel for communicating a stream of data between the first and second electronic device 102 and 104. The bidirectional channel of the connector 108 includes two data lanes and a pair of differential pins 110 coupled to the two data lanes. The pair of differential pins 110 are configured to receive a differential input signal from the first electronic device 102 or the second electronic device 104, and the differential input signal carries a serial data command or serial content data (e.g., video or audio data) that is communicated via the two data lanes of the connector 108. As such, the two data lanes and pair of differential pins 110 of the connector 108 are configured to facilitate bidirectional communication between the first electronic device 102 and the second electronic device 104. The bidirectional channel is a data channel or an auxiliary channel. Specifically, the auxiliary channel of the connector 108 is used for communication of additional serial data beyond video and audio data, such as consumer electronics control (CEC) commands. In some embodiments, the pair of differential pins 110 is coupled to a dedicated set of twisted-pair wires configured to carry two input signals of the differential input signal.

Each connector 108 of the data link 106 is configured to be coupled to a respective connector 108 of the first electronic device 102 or a respective connector 108 of the second electronic device 104. Each connector 108 of the data link 106 is bidirectional, and each connector 108 of the electronic devices 102 and 104 is bidirectional as well. When a connector 108 of the data link 106 is coupled to the first or second electronic device 102 or 104, the pair of differential pins 110 of the connector 108 of the data link 106 is physically and electrically coupled to a pair of differential pins 110 of the connector 108 of the first or second electronic device 102 or 104. The pair of differential pins 110 of the connector 108 of the first or second electronic device 102 or 104 is configured to receive data from, or transmit data to, the differential pins 110 of a connector 108 of the data link 106.

Figure 2:
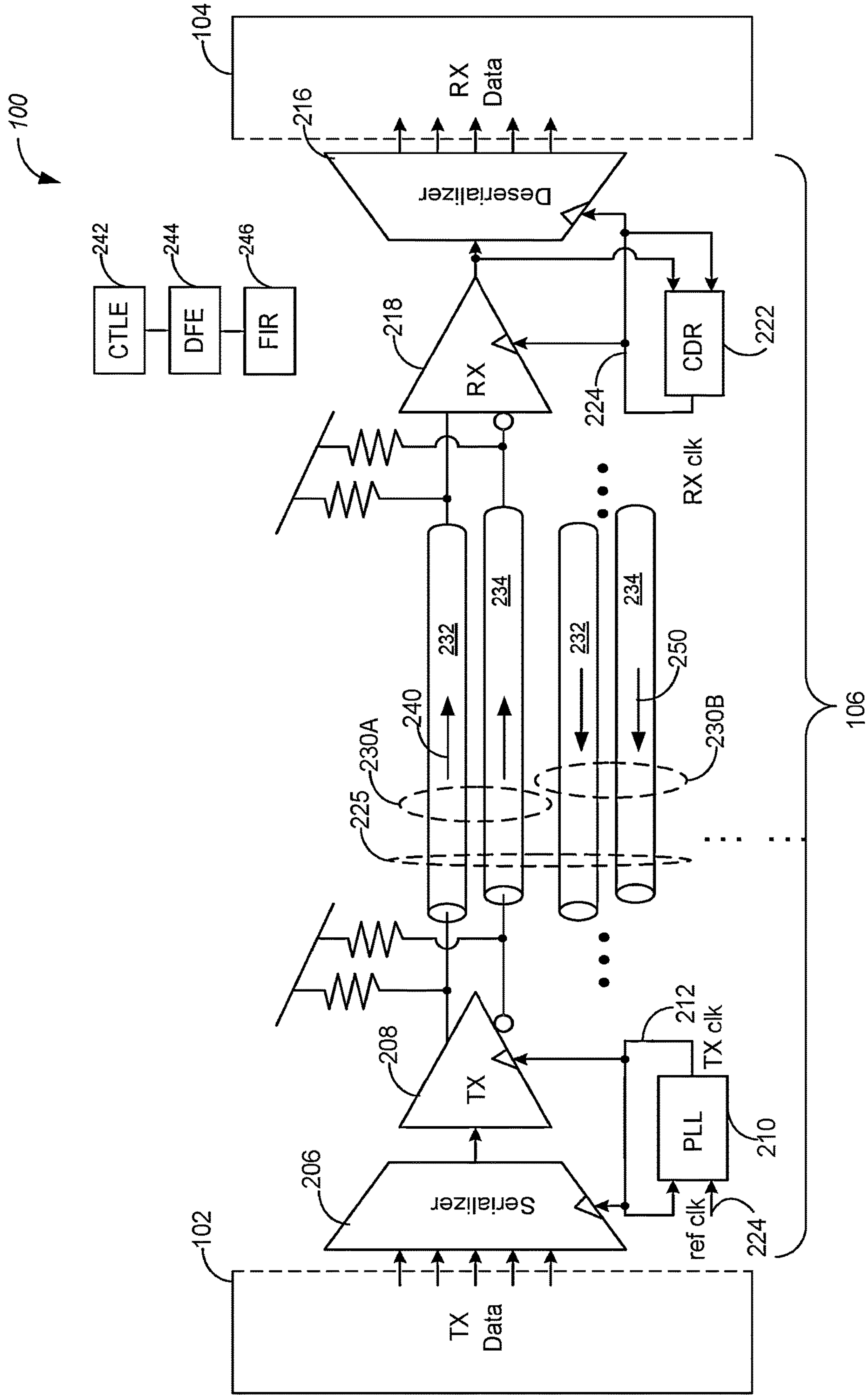
FIG. 2 is a block diagram an example electronic system in which a first electronic device or component is electrically coupled to a second electronic device or component via a data link, in accordance with some embodiments.

FIG. 2 is a block diagram of another example electronic system 100 in which a first electronic device or component 102 is electrically coupled to a second electronic device or component 104 via a data link 106, in accordance with some embodiments. In an example, the first electronic device 102 includes a central processing unit (CPU) of a personal computer, and the second electronic device 104 is a peripheral component of the personal computer, such as a graphics card, a hard drive, a solid-state drive, a Wi-Fi communication module, or an Ethernet card. The data link 106 includes a connection port for receiving data from the second electronic device 104. The connection port is optionally formed on a mother board of the personal computer. In some embodiments, the data link 106 complies with a high-speed serial computer expansion bus standard (e.g., PCI Express (PCIe) or USB 4) and provides an interface to communicate data packets between the first and second electronic devices 102 and 104 in compliance with the bus standard. The data link 106 is a serial data bus including one or more data channels 225. In some embodiments, each data channel 225 includes two wire sets 230A and 230B (also called two data lanes) for transmitting and receiving data packets, respectively, thereby supporting full-duplex communication between the first and second electronic devices 102 and 104. In some examples, the data link 106 has 1, 4, 8, or 16 channels coupled in a single data port of the data link 106. For each data channel 225, the two wire sets 230A and 230B correspond to a downstream data direction 240 and an upstream data direction 250 defined with respect to the first electronic device 102, respectively. Optionally, each wire set 230A or 230B includes two respective wires 232 and 234 for carrying a pair of differential signals.

In some embodiments, the first electronic device 102 includes or is coupled to a root complex device (not shown) that is further coupled to the data link 106. The root complex device is configured to generate requests for transactions including a series of one or more packet transmissions on behalf of the first electronic device 102. Examples of the transactions include, but are not limited to, Memory Read, Memory Read Lock, Input Output (IO) Read, IO Write, Configuration Read, Configuration Write, and Message. In some embodiments, the first electronic device 102 is coupled to one or more additional electronic devices besides the second electronic device 104. The data link 106 includes one or more switch devices to couple the root complex device of the first electronic device 102 to multiple endpoints, including the second electronic device 104 and additional electronic devices not shown in FIGS. 1 and 2.

A data transmission protocol (e.g., PCI Express) is established based on a layered model, including an application layer, a transaction layer, a data link layer, and a physical layer. As the top layer, the application layer is implemented in software programs, such as Ethernet, NVMe, SOP, AHCI, and SATA. In the transaction layer, each transaction of a series of packet transmissions is implemented as requests and responses separated by time. For example, a memory-related transaction is translated into device configuration and control data transferred to or from the second electronic device 104 (e.g., a memory device). Data packets associated with each transaction are managed by data flows on the data link layer. The physical layer controls link training and electrical (analog) signaling and includes a logical block and an electrical block. The logic block defines ordered data sets in training states, and the electrical block defines eye diagram characteristics and analog waveforms. Each layer of the layered model includes first specifications for a transmitting side where a root complex device is coupled and second specifications for a receiving side where a peripheral component (i.e., the second electronic device 104) is coupled.

As signals are transmitted within the wire sets 230 of each data channel 225 of the data link 106, the signals are distorted and spread over sequential symbols and result in inter symbol interferences (ISI) and bit errors at the receiving side of the second electronic device 104. In some embodiments, these ISI and bit errors can be suppressed by a finite impulse response (FIR) driver that is coupled serially on a path of the data link 106 and configured with equalization settings using an equalization procedure. For example, the equalization procedure is implemented when a high-speed data transfer rate needs to be initialized, when an equalization request is issued from the application layer, or when a bit error rate (BER) exceeds a data error tolerance.

The electronic system 100 includes a serializer and deserializer (SERDES) system corresponding to the data link 106. The SERDES system of the data link 106 includes a serializer 206, a transmitter 208, the data channel 225, a receiver 218, and a deserializer 216. The serializer 206 converts parallel data received from the first electronic device 102 to serial data. The transmitter 208 sends the serial data to the data channel 225. The receiver 218 processes the serial data and send the processed serial data to the deserializer 216, which converts the serial data back to the parallel data for the second electronic device 104. On a transmitting side, a phase lock loop 210 generates a transmitter clock signal 212 based on a reference clock 224, and the transmitter clock signal 212 is applied to control serialization of the data to be transmitted by the data channel 225 of the data link 106.

On a receiving side, a clock data recovery (CDR) circuit 222 is used to recover a receiver clock signal 224 from the serial data received via the data channel 225 and compensate for a variation of signal amplitudes caused by a loss and other factors in this data channel 225. The receiver clock signal 224 is used with the receiver 218 and deserializer 216 to condition the serial data received via the data channel 226 and regenerate the parallel data from the serial data. During this process, the receiver 218 is configured to reduce signal distortion, data spreading over sequential symbols, inter symbol interferences, and resulting bit errors of the serial data on the receiving side of the second electronic device 104. Specifically, in some embodiments, the receiver 218 includes a continuous time linear equalizer (CTLE) 242, a decision feedback equalizer (DFE) 244, and an FIR driver 246. The CTLE 242 is configured to selectively attenuate low frequency signal components, amplify signal components around the Nyquist frequency, and remove higher frequency signal components to generate filtered serial data. The DFE 244 is configured to further amplify the filtered serial data and recover one or more data bits at each clock switching edge or during each clock cycle. The one or more recovered data bits form data packets. The FIR driver 246 has a plurality of equalization settings (e.g., filtering coefficients), and is applied to improve signal quality of the data packets via digital signal conditioning (e.g., via high frequency filtering in a digital domain).

In some embodiments, the receiver 218 includes a sense amplifier (e.g., in the DFE 244) configured to measure a differential input signal received from the data channel 225. In some situations, the sense amplifier is directly coupled to the data channel 225 and receives and measures the differential input signal. Alternatively, in some situations, the differential input signal provided by the data channel 225 is filtered, and the processed by the sense amplifier. The differential input signal includes a pair of input signals, e.g., transmitted over the two respective wires 232 and 234 of the wire set 230A. A pair of input transistors is configured to receive the pair of input signals and enable generation of a pair of output signals from the pair of input signals during a first duty cycle of a clock signal. The pair of input transistors are coupled to one another to share a common source node (also called a tail node). The sense amplifier is coupled to a first power supply via a first current path that is coupled at the tail node and controlled by a clock signal. As a result, the tail node fluctuates with clock switching and incorporates current injection noise, which is then coupled into the pair of input signals via parasitic capacitances of the pair of input transistors.

In various embodiments of this application, a modulation circuit is coupled to the common source node (i.e., tail node) of the pair of input transistors of the sense amplifier to control noise coupled in the input signals, including current injection noise associated with clock switching, particularly when the sense amplifier is applied in a data communication path that operates under a high-speed data communication protocol (e.g., USB4 v1.0, USB4 v2.0 Gen 4 PAM-3, PCIe, DisplayPort). In some embodiments (FIG. 7), the modulation circuit includes a second current path 702 coupling the tail node of the sense amplifier to the first power supply, independently of switching of the clock signal. Alternatively, in some embodiments (FIG. 9), the modulation signal includes a switchable capacitor 902 configured to be coupled between the tail node and the first power supply according to a first polarity during the first duty cycle of the clock signal and to be coupled between a DC voltage and the first power supply according to a second polarity during a second duty cycle of the clock signal. The first polarity is opposite to the second polarity, and the second duty cycle immediately follows and is complementary to the first duty cycle. A plurality of switches (e.g., switching transistors) are optionally applied to enable the first polarity and the second polarity of the switchable capacitor. Additionally, in some embodiments, the modulation circuit includes both the second current path and the switchable capacitor, such that the noise coupled in the tail node of the sense amplifier is controlled within a tolerance.

Figure 3:
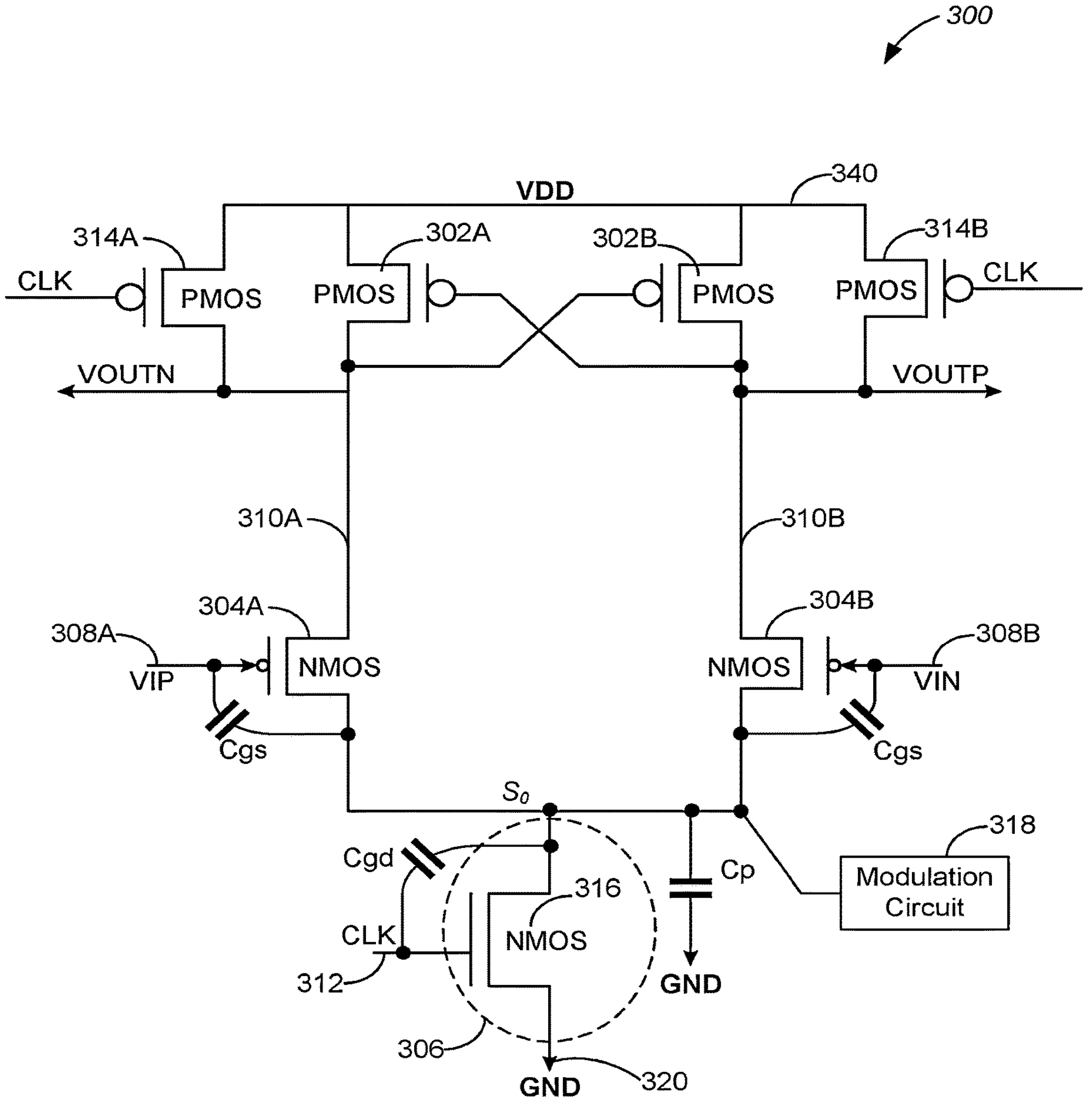
FIG. 3 is a circuit diagram of an example sense amplifier having a plurality of parasitic capacitances, in accordance with some embodiments.

FIG. 3 is a circuit diagram of an example sense amplifier 300 having a plurality of parasitic capacitances, in accordance with some embodiments. The sense amplifier 300 is applied to sense a differential input signal in different applications (e.g., a memory system, a wired data communication path), and the differential input signal has an amplitude that is smaller than an amplitude threshold. The sense amplifier 300 includes a pair of load transistors 302 (e.g., 302A and 302B), a pair of input transistors 304 (e.g., 304A and 304B), and a first current path 306. The load transistors 302A and 302B are cross-coupled to each other and makes the sense amplifier 300 operates as a strong-arm latch. A gate of the load transistor 302A is coupled to a drain of the load transistor 302B, and a gate of the load transistor 302B is coupled to a drain of the load transistor 302A. The pair of input transistors 304 is coupled to the pair of load transistors 302. For example, a drain of the input transistor 304A is coupled to the drain of the load transistor 302A, and a drain of the input transistor 304B is coupled to the drain of the load transistor 302B. The pair of input transistors 304 is configured to receive a pair of input signals 308 (e.g., 308A (VIP) and 308B (VIN)) and enable generation of a pair of output signals 310 (e.g., 310A (VOUTN) and 310B (VOUTP)) from the pair of input signals 308 during a first duty cycle of a clock signal 312. An output signal 310A is outputted at the drain of the input transistor 304A, and an output signal 310B is outputted at the drain of the input transistor 304B. The first current path 306 is coupled to the pair of input transistors 304 via a tail node $S_0$ and is controlled by the clock signal 312 (CLK) to couple the tail node $S_0$ to a first power supply 320 and enable generation of the pair of output signals 310 during the first duty cycle of the clock signal 312 (e.g., corresponding to "1"). In some situations, a second duty cycle (e.g., corresponding to "0") is complementary to the first duty cycle of the clock signal 312. During the second duty cycle of the clocks signal 312, the first current path 306 is disabled, so is the sense amplifier 300 disabled from amplifying the pair of input signals 308.

The pair of input signals 308 forms a differential input signal 308, and the pair of output signals 310 forms a differential output signal 310. In some embodiments, the differential input signal 308 corresponds to a difference of the input signals 308A and 308B, and the differential output signal 310 corresponds to a difference of the output signals 310A and 310B. The sense amplifier 300 is configured to amplify the differential input signal 308 having an input amplitude by a gain, thereby generating the differential output signal 310 having an output amplitude. In an example, the input amplitude of the differential input signal 308 is less than the amplitude threshold, and the amplified output amplitude of the differential output signal 310 corresponds to a rail-to-rail voltage (e.g., a voltage difference between two supply voltages powering the sense amplifier 300). The strong-arm latch is enabled by the pair of load transistors 302 and enables amplification of the differential input signal 308. For example, when the clock signal 312 is at "0" corresponding to a low supply voltage (i.e., during a pre-charge phase), the pair of output signals 310 is pre-charged to "1" corresponding to a high supply voltage. Conversely, when the clock signal 312 is at "1" corresponding to the high supply voltage (i.e., during a latch stage), the pair of input transistors 304 starts to amplify the differential input signal 308 to the differential output signal 310. The pair of load transistors 302 provides a positive feedback to expedite amplification of the differential input signal 308 to the differential output signal 310 close to the rail-to-rail voltage.

In some embodiments, the pair of load transistors 302 is coupled to a second power supply 340 (e.g., VDD) distinct from the first power supply 320 (e.g., GND, VSS), and the clock signal 312 varies between supply voltages of the first power supply 320 and the second power supply 340. Further, in an example, the second power supply 340 includes a positive power supply (e.g., at 1.5V), and the first power supply 320 includes a negative power supply (e.g., at −1.5V). In an example, the second power supply 340 includes a positive power supply (e.g., at 1.5V), and the first power supply 320 includes a ground (e.g., at 0V). In some embodiments, the sense amplifier 300 is applied in a high-speed data interface in a wired data communication path. The clock signal 312 has a clock frequency that is greater than a threshold frequency (e.g., 2 GHz).

In some embodiments, the sense amplifier 300 includes a pair of precharge transistors 314. A precharge transistor 314A is coupled to the load transistor 302A and coupled between a second power supply 340 (e.g., VDD) and the output signal 310A of the sense amplifier 300, and a precharge transistor 314B is coupled to the load transistor 302B and coupled between the second power supply 340 (e.g., VDD) and the output signal 310B of the sense amplifier 300. The pair of precharge transistors 314 is configured to precharge the pair of output signals to a supply voltage of the second power supply 340, during a second duty cycle of the clock signal 312 (e.g., corresponding to "0"). The second duty cycle of the clock signal 312 is complementary to the first duty cycle. During the first duty cycle of the cock signal 312, the pair of precharge transistors 314 is turned off, and the pair of load transistors 302 facilitates amplification of the differential input signal 308 to the differential output signal 310.

In some embodiments, the pair of input transistors 304 is a pair of N-type transistors, and the pair of load transistors 302 and the pair of precharge transistors 314 (if any) are P-type transistors. The supply voltage of the second power supply 340 is higher than that of the first power supply 320. For example, the first power supply 320 includes a ground (GND) or a negative power supply (VSS) that is lower than the ground, and the second power supply 340 includes a positive power supply (VDD). Conversely, in some embodiments not shown in FIG. 3, the pair of input transistors 304 is a pair of P-type transistors, and the pair of load transistors 302 and the pair of precharge transistors 314 (if any) are N-type transistors. The supply voltage of the second power supply 340 is lower than that of the first power supply 320. For example, the second power supply 340 includes a ground (GND) or a negative power supply (VSS) that is lower than the ground, and the first power supply 320 includes a positive power supply (VDD).

In some embodiments, the first current path 306 further includes a control transistor 316 having a gate coupled to the clock signal 312. The control transistor 316 is coupled between the tail node $S_0$ and the first power supply 320. During the first duty cycle (i.e., the latch phase) of the clock signal 312, the clock signal 312 enables the control transistor 316, and the pair of input transistors 304 amplifies the pair of input signals 308. The second duty cycle of the clock signal 312 is complementary and opposite to the first duty cycle. During the second duty cycle (i.e., the precharge phase) of the clock signal 312, the clock signal 312 disables the control transistor 316 and the first current path 306, so is the pair of input transistors 304 disabled from amplifying the differential input signal 308.

In some embodiments, the tail node $S_0$ is coupled to a plurality of parasitic capacitors including one or more of: a pair of gate-to-source parasitic capacitors $C_{gs}$ formed between the tail node $S_0$ and gates of the pair of input transistors 304, a gate-to-drain parasitic capacitor $C_{gd}$ formed between the tail node $S_0$ and a gate of a control transistor 316 coupled in the first current path 306, and a supply parasitic capacitor $C_p$ formed between the tail node $S_0$ and the first power supply 320. The supply parasitic capacitor $C_p$ has a capacitance combining drain-to-source capacitance of the control transistor 316, parasitic capacitances between the first power supply 320 and sources of the input transistors 304A and 304B, and wiring or other fringing capacitance connected to the tail node $S_0$. Further, in some situations, switching of the clock signal 312 induces a variation at the tail node $S_0$ via the parasitic capacitor $C_{gd}$, and the variation at the tail node $S_0$ further induces a variation in each input signal 308A or 308 via a respective parasitic capacitors $C_{gs}$. It is noted that the parasitic capacitors $C_{gs}$, $C_{gd}$, and $C_p$ result from device structures and circuit architecture, and do not represent discrete capacitor components as marked on different figures of this application.

A modulation circuit 318 is coupled to the tail node $S_0$ to control an impact of clock switching induced by the parasitic capacitors coupled to the tail node $S_0$, e.g., by reducing a voltage variation of the tail node $S_0$ caused by clock switching. In some embodiments, the modulation circuit 318 includes a second current path 702 (FIG. 7) coupled to the tail node $S_0$. The second current path 702 is not controlled by the clock signal 312 or an associated signal, allowing the second current path 702 to electrically couple the tail node $S_0$ to the first power supply 320, independently of switching of the clock signal 312. In some embodiments, the modulation circuit 318 includes a switchable capacitor 902 (FIG. 9). The switchable capacitor 902 provides charge opposite to charge injected due to clock switching during the first duty cycle of the clock signal 312, thereby compensating for current injection noise caused by clock switching.

FIG. 4A is a circuit diagram of another example sense amplifier 300, in accordance with some embodiments, and FIG. 4B is a circuit diagram of an example sense amplifier 300 having a plurality of parasitic capacitances, in accordance with some embodiments. The sense amplifier 300 is applied to sense a differential input signal 308 that optionally has an amplitude that is smaller than an amplitude threshold. The sense amplifier 300 includes a pair of load transistors 302 (e.g., 302A and 302B), a pair of latch transistors 402 (e.g., 402A and 402B), a pair of input transistors 304 (e.g., 304A and 304B), and a first current path 306. The load transistors 302A and 302B are cross-coupled to each other. The pair of input transistors 304 is coupled to the pair of load transistors 302. A latch transistor 402A is coupled in series between a load transistor 302A and an input transistor 304A, e.g., forming a first complementary metal-oxide semiconductor (CMOS) inverter with the load transistor 302A. A latch transistor 402B is coupled in series between a load transistor 302B and an input transistor 304B, e.g. forming a second CMOS inverter with the load transistor 302B. The pair of input transistors 304 is configured to receive a pair of input signals 308 (e.g., 308A (VIP) and 308B (VIN)) and enable generation of a pair of output signals 310 (e.g., 310A (VOUTN) and 310B (VOUTP)) from the pair of input signals 308 during a first duty cycle of a clock signal 312. An output signal 310A is outputted at drains of the load transistor 302A and the latch transistor 402A, and an output signal 310B is outputted at drains of the load transistor 302B and the latch transistor 402B. The first current path 306 is coupled to the pair of input transistors 304 via a tail node $S_0$ and is controlled by the clock signal 312 (CLK) to couple the tail node $S_0$ to a first power supply 320 and enable generation of the pair of output signals 310 during the first duty cycle of the clock signal 312 (e.g., corresponding to "1"). In some situations, a second duty cycle (e.g., corresponding to "0") is complementary to the first duty cycle of the clock signal 312. During the second duty cycle of the clocks signal 312, the first current path 306 is disabled, so is the sense amplifier 300 disabled from amplifying the pair of input signals 308. In some embodiments, the first duty cycle and the second duty cycle of the clock signal 312 correspond to a latch phase and a precharge phase, respectively.

In some embodiments, the tail node $S_0$ is coupled to a plurality of parasitic capacitors including one or more of: a pair of gate-to-source parasitic capacitors $C_{gs}$ formed between the tail node $S_0$ and gates of the pair of input transistors 304, a gate-to-drain parasitic capacitor $C_{gd}$ formed between the tail node $S_0$ and a gate of a control transistor 316 coupled in the first current path 306, and a supply parasitic capacitor $C_p$ formed between the tail node $S_0$ and the first power supply 320. Capacitance of the supply parasitic capacitor $C_p$ includes drain-to-source capacitance of the control transistor 316, parasitic capacitances between the first power supply 320 and sources of the input transistors 304A and 304B, and wiring or other fringing capacitance connected to the tail node $S_0$.

When the clock signal 312 switches from "1" to "0" or from "0" to "1," charge is induced at, and injected into, the tail node $S_0$ due to existence of the gate-to-drain parasitic capacitor $C_{gd}$, and further induces charge and noise at gates of the input transistors 304A and 304B due to the gate-to-source parasitic capacitors $C_{gs}$. The sense amplifier 300 receives the input signals 308 at the gates of the input transistors 304A and 304B, and therefore, degraded by the noise induced thereon due to the parasitic capacitors $C_{gd}$ and $C_{gs}$. Additionally, during the first duty cycle (e.g., corresponding to "1") of the clock signal 312, a voltage level at the tail node $S_0$ fluctuates near the first power supply 320. Both electrodes of the supply parasitic capacitor $C_p$ are biased substantially at the first power supply 320, and no or little charge is stored by the supply parasitic capacitor $C_p$. During the second duty cycle (e.g., corresponding to "0") of the clock signal 312, the voltage level at the tail node $S_0$ fluctuates near a tail voltage $V_{TL}$ (e.g., 200 mV), which depends on an input common mode voltage of the input signals 308 and a threshold voltage of the input transistors 304. The supply parasitic capacitor $C_p$ is biased between the tail voltage $V_{TL}$ and the first power supply 320, which determines amount of charge stored on the capacitor $C_p$. As such, switching of the clock signal 312 changes the amount of charge stored in the supply parasitic capacitor $C_p$, thereby causing kick-back charge injection and introducing additional charge injection noise into the input signals 304 via the gate-to-source parasitic capacitors $C_{gs}$.

In some embodiments, when the clock signal 312 switches from "0" to "1," the sense amplifier 300 is enabled to amplify the differential input signal 308 to the differential output signal 310. In response to clock switching from "0" to "1," charge is injected into the gates of the input transistors 304 to create charge injection noise in the differential input signal 308. The charge injection noise is amplified with the differential input signal 308 to degrade the differential output signal 310. In some embodiments, in response to clock switching from "1" to "0," charge is injected into the gates of the input transistors 304 to create charge injection noise in the differential input signal 308. The charge injection noise associated with clock switching from "1" to "0" is opposite to the charge injection noise associated with clock switching from "0" to "1." In some embodiments, the differential input signal 308 is provided to a plurality of sensing amplifiers 300 that latch the differential input signal 308 under control of phased clock signals 312. The charge injection noise associated with both any clock switching from "1" to "0" and clock switching from "0" to "1" degrades the differential input signal 308 and performance of an entire electronic system 100 including the plurality of sensing amplifiers 300.

Figure 4:
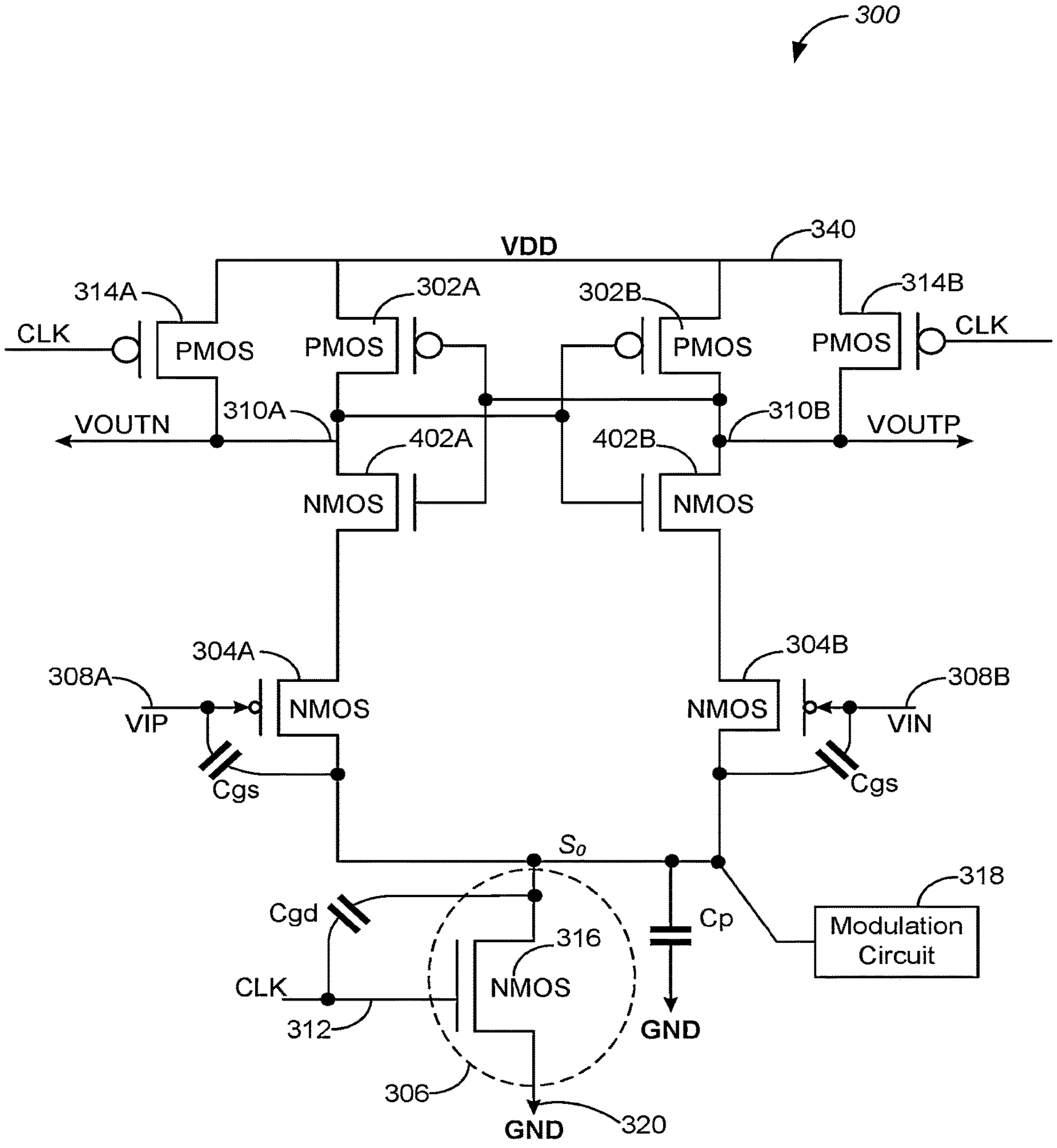
FIG. 4 is a circuit diagram of another example sense amplifier having a plurality of parasitic capacitances, in accordance with some embodiments.
Figure 5:
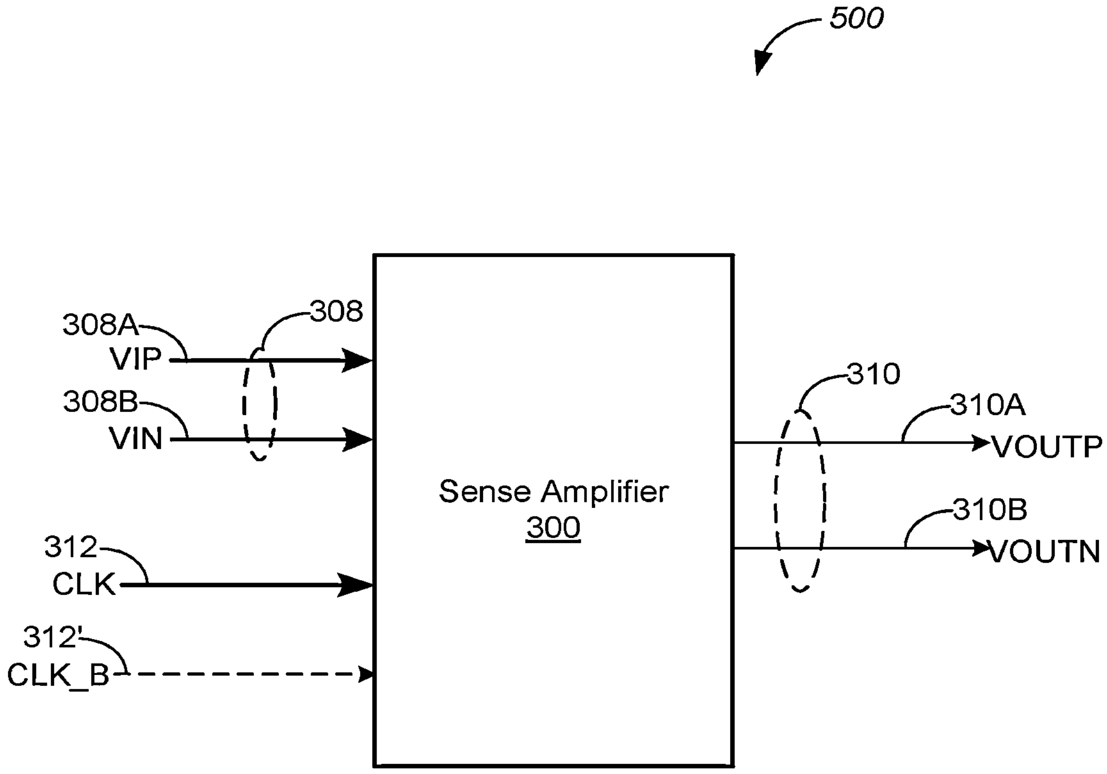
FIG. 5 is a symbolic diagram of an example circuit symbol representing a sense amplifier, in accordance with some embodiments.

FIG. 5 is a symbolic diagram of an example circuit symbol 500 representing a sense amplifier 300, in accordance with some embodiments. The sense amplifier 300 is also called a data slicer, a level shifter, or a strong-arm latch circuit. The sense amplifier 300 receives a differential input signal 308 and a clock signal 312 (CLK). The differential input signal 308 includes a pair of input signals 308 (e.g., 308A (VIP) and 308B (VIN)). Further, in some embodiments, the sense amplifier 300 also receives an inverse signal 312' that is complementary and opposite to the clock signal 312, and applies the inverse signal 312' to control a modulation circuit 318 (FIGS. 3 and 4). The sense amplifier 300 generates of a differential output signal 310 including a pair of output signals 310 (e.g., 310A (VOUTP) and 310B (VOUTN)) from the pair of input signals 308 during a first duty cycle of the clock signal 312 (e.g., corresponding to "1").

In some embodiments, each of the pair of input signals 308, 308A (VIP) or 308B (VIN), is configured to vary between a first input voltage level and a second input voltage level. Each of the pair of output signals 310, 310A (VOUTP)

or 310B (VOUTN), is configured to vary between a first supply voltage of the first power supply 320 and a second supply voltage of a second power supply 340 distinct from the first power supply 320. At least one of the first input voltage level and the second input voltage level is distinct from both the first supply voltage 320 and the second supply voltage 340. For example, the first supply voltage of the first power supply 320 is 0V, and the second supply voltage of the second power supply 340 is 2.5V. The input signal 308A or 308B varies between 0V and 0.5V and is amplified to the pair of output signals 310 varying between 0V and 2.5V. In other words, the sense amplifier 300 includes a level shifter.

Figure 6A:
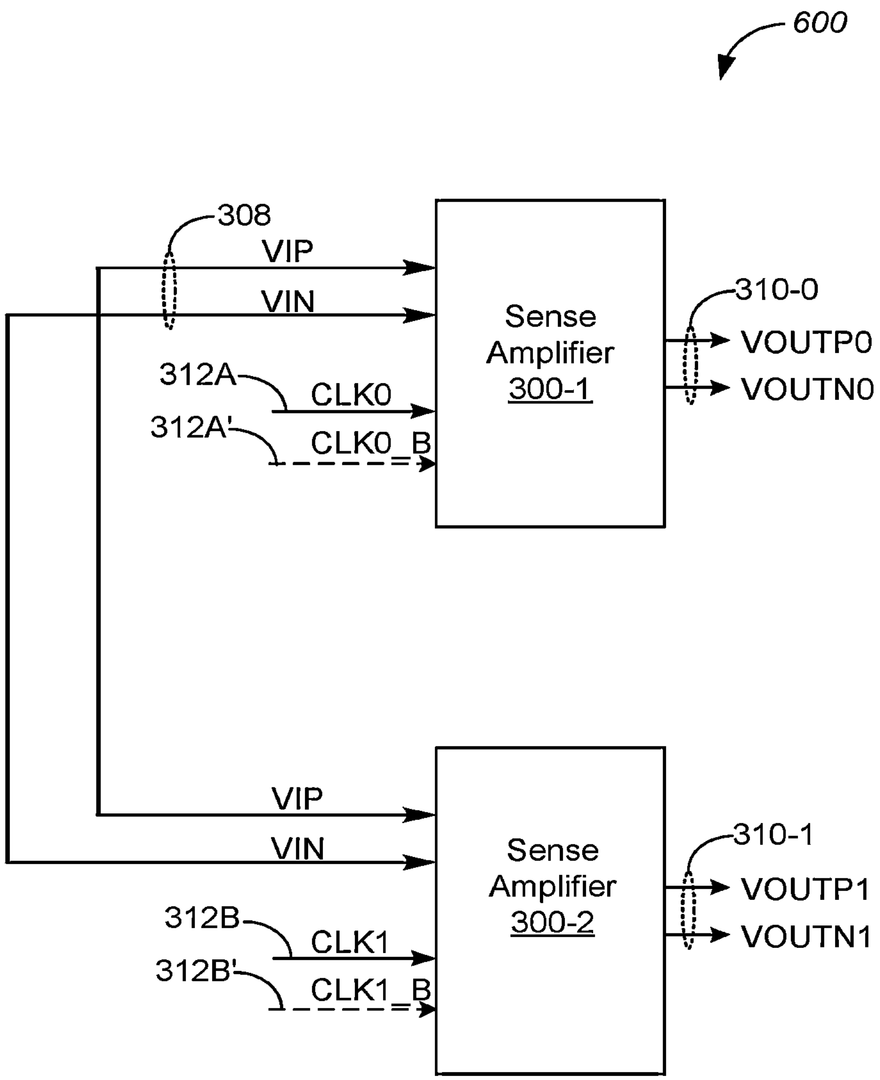
FIG. 6A is a schematic diagram of a data interface circuit including two sense amplifiers, in accordance with some embodiments, and FIG. 6B provides temporal diagrams of two clock signals and a differential input signal, in accordance with some embodiments.
Figure 6B:
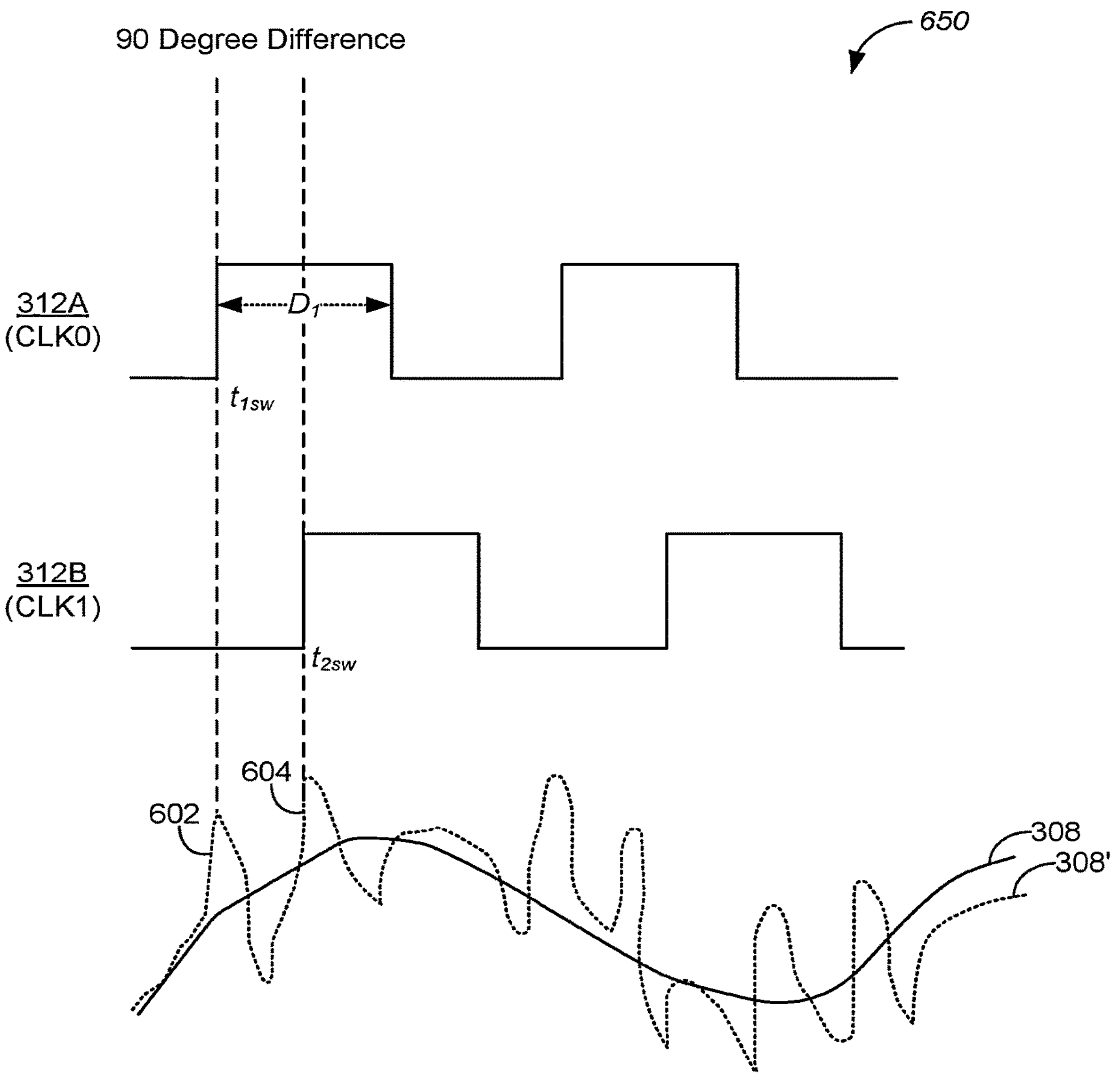

FIG. 6A is a schematic diagram of a data interface circuit 600 including two sense amplifiers 300-0 and 300-1, in accordance with some embodiments, and FIG. 6B illustrates temporal diagrams 650 of two clock signals 312A (CLK0) and 312B (CLK1) and a differential input signal 308, in accordance with some embodiments. Each of the sense amplifier 300-0 and 300-1 includes a respective sense amplifier 300 shown in FIG. 3 or 4. The differential input signal 308 includes a pair of input signals 308 (e.g., 308A (VIP) and 308B (VIN)). A first sense amplifier 300-0 receives the differential input signal 308 and a first clock signal 312A (CLK0) and generates a first differential output signal 310-0 (e.g., VOUTP0 and VOUTN0). In some embodiments, the first sense amplifier 300-0 further receives a first inverse signal 312A' (CLK0_B) to generate the output signal 310-0, e.g., by applying the inverse signal 312A' to control a modulation circuit 318 (FIGS. 3 and 4). A second sense amplifier 300-1 receives the differential input signal 308 and a second clock signal 312B (CLK1) and generates a second differential output signal 310-1 (e.g., VOUTP1 and VOUTN1). In some embodiments, the second sense amplifier 300-1 further receives a second inverse signal 312B' (CLK1_B) to generate the output signal 310-1, e.g., by applying the inverse signal 312B' to control a modulation circuit 318 (FIGS. 3 and 4). Stated another way, the first and second sense amplifier 300-0 and 300-1 are controlled by two distinct clock signals 312A and 312B to generate their respective differential output signals 310-0 and 310-1, respectively.

Referring to FIG. 6B, in some embodiments, the first and second clock signals 312A and 312B have a clock frequency $f_{CLK}$ corresponding to a clock period $T_{CLK}$. The second clock signal 312B is delayed by a quarter of the clock period (¼ $T_{CLK}$), i.e., shifted in phase by 90°, with respect to the first clock signal 312A. Every time the first clock signal 312A or second clock signal 312B switches, charge injection noise causes at least overshoot or an undershoot on the differential input signal 308. The current injection noise from different clock switching occurrences is superimposed on the differential input signal 308 to generate a degraded differential input signal 308' having a compromised signal-to-noise ratio (SNR) compared with the differential input signal 308. Specifically, in some embodiments, the first clock signal 312A switches from "0" to "1" at a first instant $t_{1sw}$. The second clock signal 312B switches from "0" to "1" at a second instant $t_{2sw}$, while the sense amplifier 300-0 is enabled after the first instant $t_{1sw}$, and during a first duty cycle $D_I$ of the first clock signal 312A (e.g., corresponding to "1"). At the first instant $t_{1sw}$, at least a first overshoot 602 of the current injection noise is induced at the differential input signal 308 of both amplifiers 300-0 and 300-1, by way of the tail node $S_0$ of the first sense amplifier 300-0. At the second instant $t_{2sw}$, at least a second overshoot 604 of current injection noise is induced at the differential input signal 308 of both amplifiers 300-0 and 300-1, by way of the tail node $S_0$ of the second sense amplifier 300-1. The overshoots 602 and 604 degrade the SNR of the differential input signal 308 during the first duty cycle $D_I$ of the first clock signal 312A, when the sense amplifier 300-0 is enabled to amplify the differential input signal 308. As such, the differential output signal 310 is degraded by the current injection noise induced by switching from "0" to "1" of both the first and second clock signals 312A and 312B.

For each of the sense amplifier 300-0 and 300-1, a modulation circuit 318 is coupled to the respective tail node $S_0$ and configured to reduce the charge injection noise induced at the differential input signal 308 by way of the respective tail node $S_0$. A first modulation circuit 318 is coupled to the tail node $S_0$ of the first sense amplifier 300-0 and reduces the charge injection noise (e.g., the first overshoot 602) induced at the input signal 308 by way of the tail node $S_0$ of first sense amplifier 300-0. A second modulation circuit 318 is coupled to the tail node $S_0$ of the second sense amplifier 300-1 and reduces the charge injection noise (e.g., the second overshoot 604) induced at the input signal 308 by way of the tail node $S_0$ of second sense amplifier 300-1.

Figure 7:
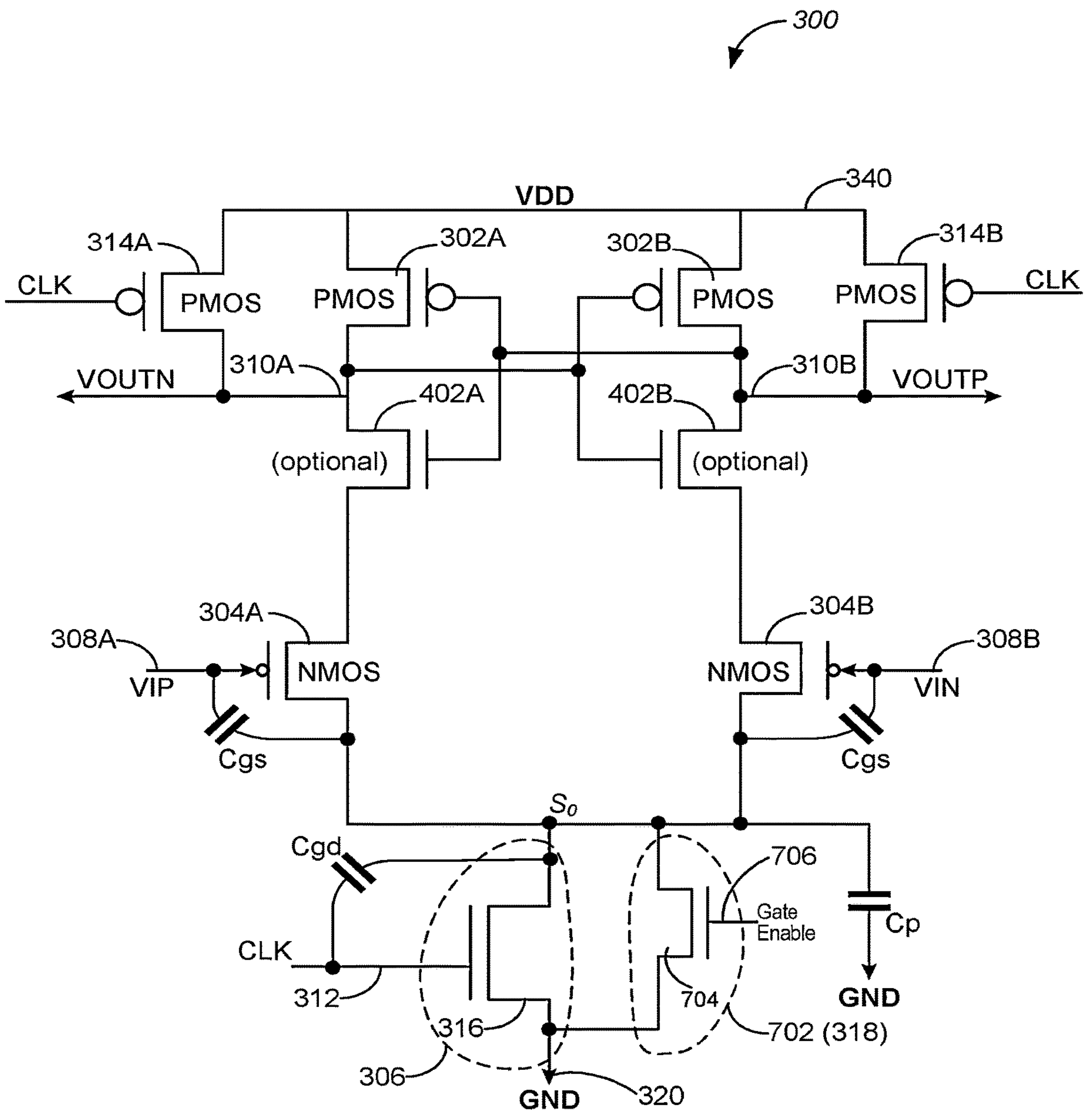
FIG. 7 is a circuit diagram of another example sense amplifier having two current paths, in accordance with some embodiments.

FIG. 7 is a circuit diagram of another example sense amplifier 300 having two current paths 306 and 702, in accordance with some embodiments. The sense amplifier 300 is applied to sense a differential input signal 308 that optionally has an amplitude that is smaller than an amplitude threshold. The sense amplifier 300 includes a pair of load transistors 302 (e.g., 302A and 302B), a pair of input transistors 304 (e.g., 304A and 304B), a first current path 306, and a second current source 702. The load transistors 302A and 302B are cross-coupled to each other. The pair of input transistors 304 is coupled to the pair of load transistors 302. The pair of input transistors 304 is configured to receive a pair of input signals 308 (e.g., 308A (VIP) and 308B (VIN)) and enable generation of a pair of output signals 310 (e.g., 310A (VOUTN) and 310B (VOUTP)) from the pair of input signals 308 during a first duty cycle of a clock signal 312. The first current path 306 is coupled to the pair of input transistors 304 via a tail node $S_0$ and is controlled by the clock signal 312 (CLK) to couple the tail node $S_0$ to a first power supply 320 and enable generation of the pair of output signals 310 during the first duty cycle of the clock signal 312 (e.g., corresponding to "1"). In some situations, a second duty cycle (e.g., corresponding to "0") is complementary to the first duty cycle of the clock signal 312. During the second duty cycle of the clock signal 312, the first current path 306 is disabled, so is the sense amplifier 300 disabled from amplifying the pair of input signals 308.

The second current path 702 is coupled to the tail node $S_0$ and configured to electrically couple the tail node $S_0$ to the first power supply 320, independently of switching of the clock signal 312. In some embodiments, the second current path 702 further includes a bypass transistor 704 coupled between the tail node $S_0$ and the first power supply 320. The bypass transistor 704 is configured to receive a gate enable signal 706 and be turned on to keep the tail node $S_0$ electrically coupled to the first power supply 320, independently of switching of the clock signal 312. In some embodiments, the first current path 306 includes a control transistor 316 controlled by the clock signal 312. The control transistor 316 is arranged in parallel with the bypass transistor 704. A size of the control transistor 316 is greater than a size of the bypass transistor 704. By these means, the second current path 702 acts as a modulation circuit 318 configured to control charge injection noise at the tail node $S_0$.

In some embodiments, the sense amplifier 300 further includes a pair of latch transistors 402 (e.g., 402A and 402B), A latch transistor 402A is coupled in series between a load transistor 302A and an input transistor 304A. A latch transistor 402B is coupled in series between a load transistor 302B and an input transistor 304B. An output signal 310A is outputted at drains of the load transistor 302A and the latch transistor 402A, and an output signal 310B is outputted at drains of the load transistor 302B and the latch transistor 402B.

In some embodiments, the sense amplifier 300 is applied in a high-speed data interface in a wired data communication path. The clock signal 312 has a clock frequency that is greater than a threshold frequency (e.g., 2 GHz).

Figure 8A:
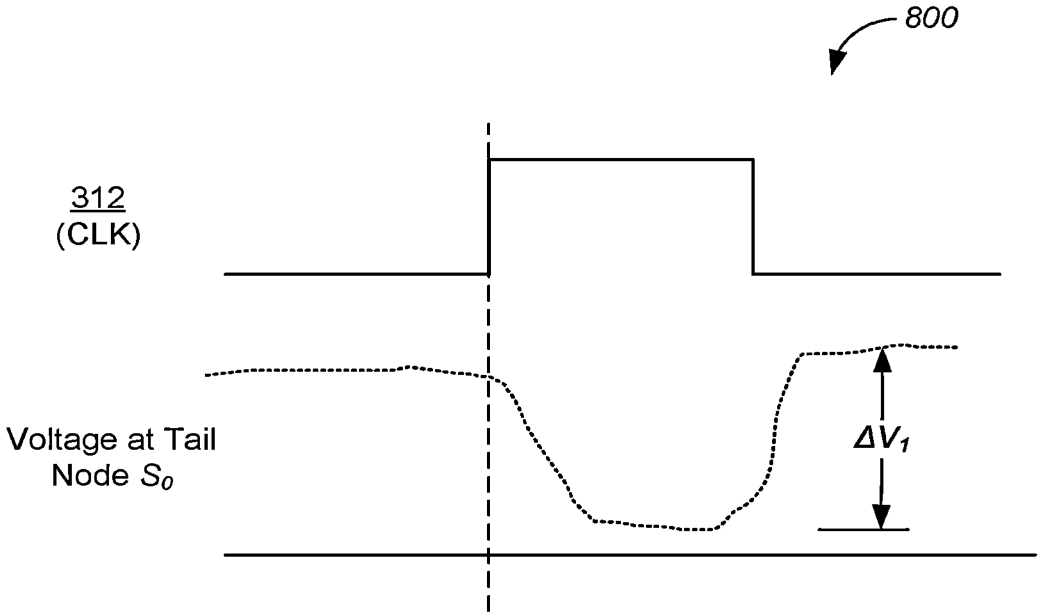
FIG. 8A provides temporal diagrams of a clock signal and a tail node of a sense amplifier having a single current path, in accordance with some embodiments, and FIG. 8B provides temporal diagrams of a clock signal and a tail node of a sense amplifier having two current paths, in accordance with some embodiments.
Figure 8B:
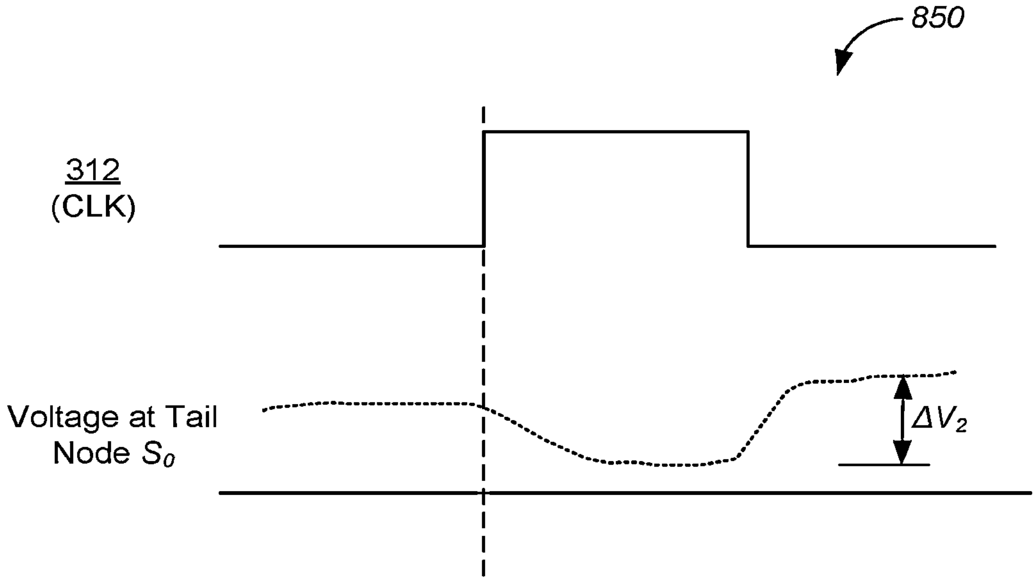

FIG. 8A illustrates temporal diagrams 800 of a clock signal 312 and a tail node $S_0$ of a sense amplifier 300 having a single current path 306, in accordance with some embodiments, and FIG. 8B illustrates temporal diagrams 850 of a clock signal 312 and a tail node $S_0$ of a sense amplifier 300 having two current paths 306 and 702, in accordance with some embodiments. Referring to FIG. 8A, in some embodiments, the sense amplifier 300 does not include the second current path 702, and the first current path 306 is turned on and off during the first and second duty cycles of the clock signal 312, respectively. A voltage level of the tail node $S_0$ varies by a first variation voltage $\Delta V_1$.

Referring to 8B, in some embodiments, the sense amplifier 300 includes both the first current path 306 and second current path 702. The bypass transistor 704 is controlled to remain constantly on, such that the second current path 702 is constantly enabled during both the first and second duty cycles of the clock signal 312. This protects a voltage level of the tail node $S_0$ from fluctuating beyond a tolerance and reduces charge that is injected to the differential input signal 308 by way of the tail node $S_0$ due to clock switching. A voltage level of the tail node $S_0$ varies by a second variation voltage $\Delta V_2$. The second variation voltage $\Delta V_2$ is smaller than the first variation voltage $\Delta V_1$, and the first variation voltage $\Delta V_1$ is reduced based on application of the bypass transistor 704. In other words, the bypass transistor 704 reduces fluctuation of the voltage level the tail node $S_0$ caused by parasitic-induced charge injection.

Figure 9A:
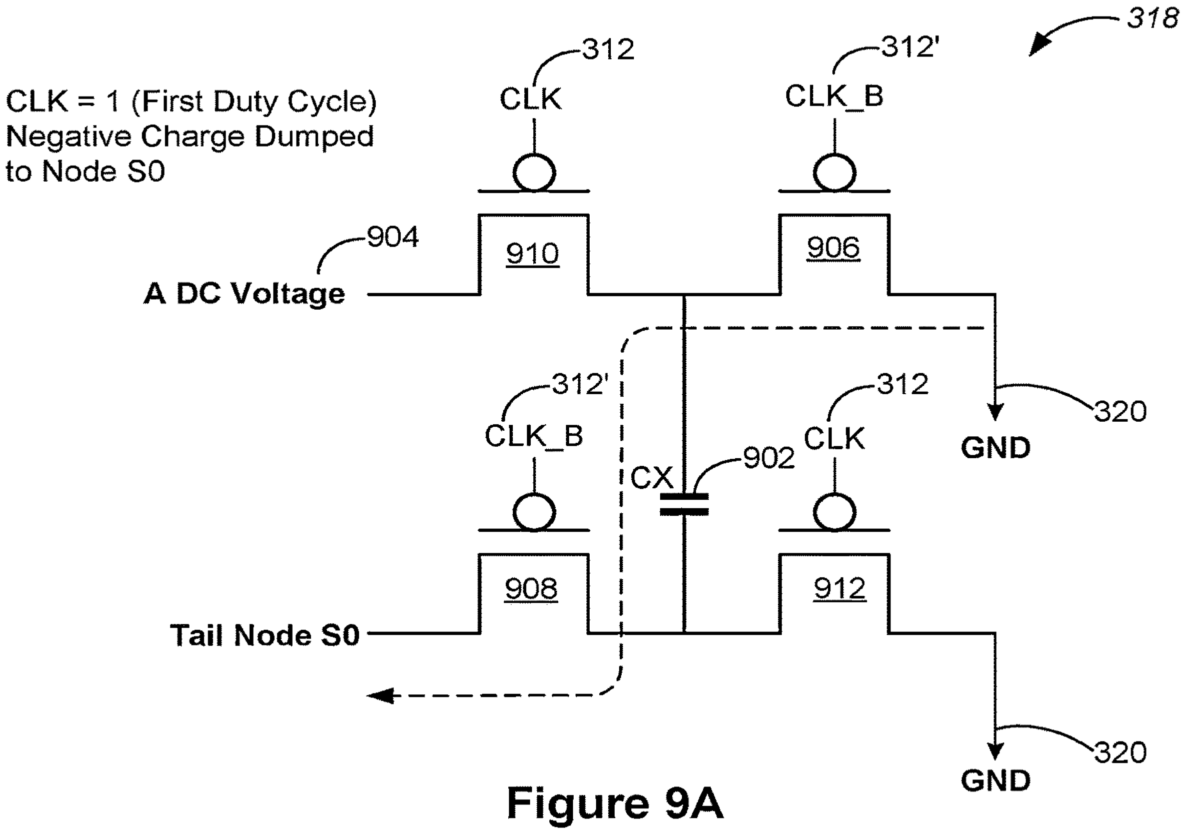
FIGS. 9A and 9B are circuit diagrams of another example modulation circuit including a switchable capacitor that is charged and discharged during two distinct duty cycles of a clock signal, in accordance with some embodiments.
Figure 9B:
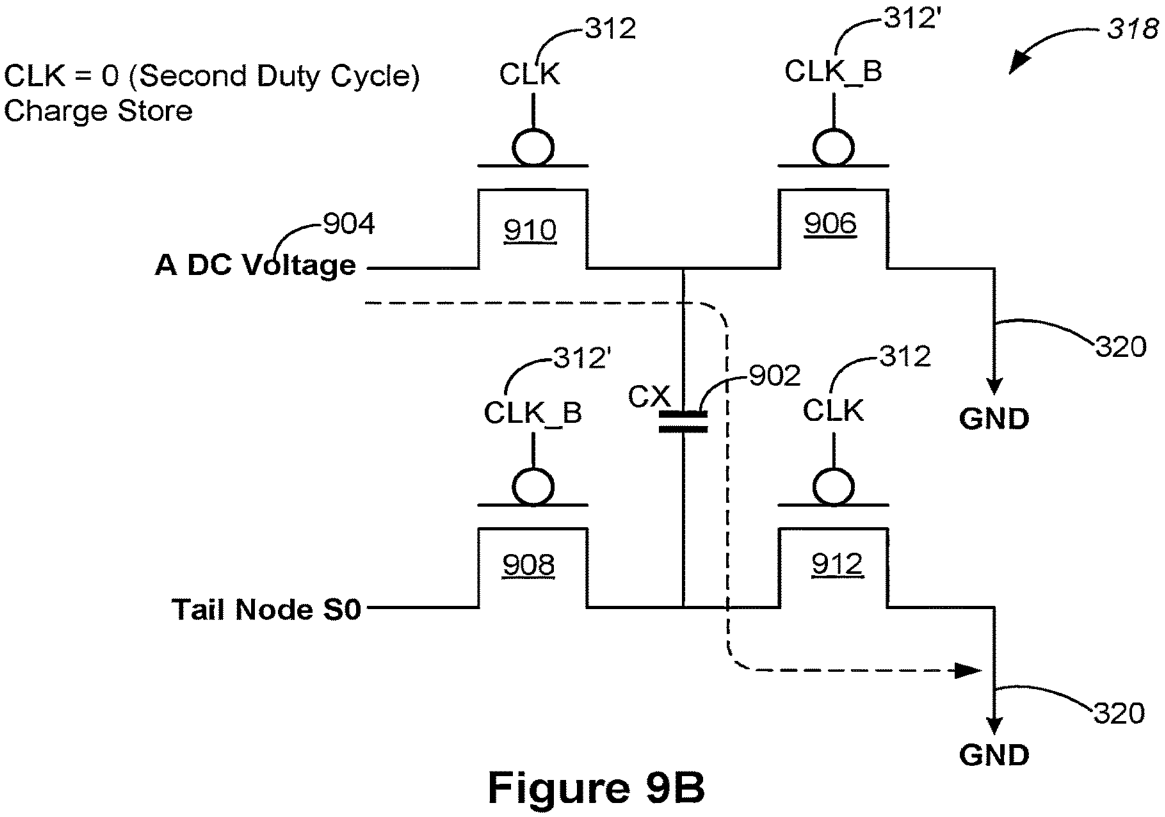

FIGS. 9A and 9B are circuit diagrams of another example modulation circuit 318 including a switchable capacitor 902 (CX) that are charged and discharged during two distinct duty cycles of a clock signal 312, in accordance with some embodiments. The two distinct duty cycles of the clock signal 312 include a first duty cycle (e.g., corresponding to “1”) and a second duty cycle (e.g., corresponding to “0”). The switchable capacitor 902 includes a first electrode and a second electrode. During the first duty cycle of the clock signal, the first electrode is electrically coupled to the first power supply 320, and the second electrode is electrically coupled to the tail node S0. The switchable capacitor 902 is coupled between the tail node $S_0$ and the first power supply 320 according to a first polarity during the first duty cycle of the clock signal 312. During the second duty cycle of the clock signal 312, the first electrode is electrically coupled to the DC voltage 904, and the second electrode is electrically coupled to the first power supply 320. The switchable capacitor 902 is coupled between a DC voltage 904 and the first power supply 320 according to a second polarity during a second duty cycle of the clock signal 312. The first polarity is opposite to the second polarity, and the second duty cycle (e.g., corresponding to “0”) immediately follows and is complementary to the first duty cycle (e.g., corresponding to “1”).

In some embodiments, four switches 906-912 are applied to couple the switchable capacitor 902 between two of the DC voltage 904, the tail node $S_0$, and the first power supply 320. For example, a first switch 906 is coupled between the first electrode of the switchable capacitor 902 and the first power supply 320. A second switch 908 is coupled between the second electrode of the switchable capacitor 902 and the tail node $S_0$. A third switch 910 is coupled between the first electrode and the DC voltage 904, and a fourth switch 912 is coupled between the second electrode and the first power supply 320. Referring to FIG. 9A, in some embodiments, the first switch 906 and the second switch 908 are controlled by an inverse signal 312' (CLK_B) that is inverse to the clock signal 312 to charge the switchable capacitor 902 during the first duty cycle according to the first polarity. Referring to FIG. 9A, in some embodiments, the third switch 910 and the fourth switch 912 are controlled by the clock signal 312 to charge the switchable capacitor 902 during the second duty cycle according to the second polarity.

Referring to FIGS. 9A and 9B, in some embodiments, each of the switches 906-912 includes a P-type transistor. The first switch 906 and the second switch 908 are controlled by the inverse signal 312' (CLK_B) concurrently, and the third switch 910 and the fourth switch 912 are controlled by the clock signal 312 (CLK) concurrently. Alternatively, in some embodiments not shown, each of the switches 906-912 includes an N-type transistor. The first switch 906 and the second switch 908 are controlled by the clock signal 312 (CLK) concurrently, and the third switch 910 and the fourth switch 912 are controlled by the inverse signal 312' (CLK_B) concurrently. Additionally and alternatively, in some embodiments not shown, each of the switches 906-912 includes a transmission gate having an N-type transistor and a P-type transistor, and is controlled by both the clock signal 312 (CLK) and the inverse signal 312' (CLK_B) jointly. The first switch 906 and the second switch 908 are controlled concurrently, and the third switch 910 and the fourth switch 912 are controlled concurrently.

In some embodiments, the DC voltage 904 is configured to be adjusted based on a noise level of the pair of input signals 308. A P-type transistor is turned on when a gate voltage corresponds to “0”. The inverse signal 312' (CLK_B) is opposite and complementary to the clock signal 312 (CLK) and corresponds to “0” when the clock signal 312 corresponds to “1.” Referring to FIG. 9B, when CLK=0, charge Q is stored at the switchable capacitor 902, and is a product of the DC voltage 904 and the capacitance of the switchable capacitor 902. Referring to FIG. 9A, when CLK=1 (CLK_B=0), the charge Q is inversely (negatively) applied to the tail node $S_0$ to compensate for charge injected from the control transistor 316 of the first current path 306. In some embodiments, the capacitance of the switchable capacitor 902 and the DC voltage 904 are pre-calculated and optimized by simulation tools. In an example, the DC voltage 904 is equal to a supply voltage of the second power supply 340.

In some embodiments, during the second duty cycle of the clock signal 312, the switchable capacitor 902 is decoupled from the tail node $S_0$, and the tail node $S_0$ increases from a first tail voltage and settles at a second tail voltage. The switchable capacitor 902 is biased with the DC voltage 904 according to a second polarity. Conversely, during the first duty cycle of the clock signal, the switchable capacitor 902 is coupled to the tail node $S_0$, and the tail node $S_0$ gradually increases from the second tail voltage to the first tail voltage. The switchable capacitor 902 having a second polarity is being charged to a first polarity opposite to the second polarity, thereby controlling an overshoot of the tail node $S_0$ coupled to the switchable capacitor 902. Stated another way, the switchable capacitor 902 pre-stores charge at the switchable capacitor 902 during the second duty cycle, and applies the charge during the first duty cycle to compensate for opposite charge injected due to clock switching at the tail node $S_0$, thereby reducing charge injection noise in the tail node $S_0$ and the input signals 308 of the sense amplifier. Additionally, during the first duty cycle of the clock signal 312, the switchable capacitor 902 is coupled to the tail node $S_0$ and facilitates holding the tail node $S_0$ at the first tail voltage, such that the tail node $S_0$ of each sense amplifier 300 is less susceptible to current injection noise coupled from clock switching in other sense amplifier(s) 300.

In some embodiments, the modulation circuit 318 including the switchable capacitor 902 provides benefits of charge compensation from at least three aspects. First, charge is pre-stored in the switchable capacitor 902 and applied in a negative manner to compensate for charge injection caused by clock switching and reduce associated charge injection noise. Second, the inverse signal 312' (CLK_B) has an opposite phase to that of the clock signal 312 (CLK) and is applied as a compensating clock at the tail node $S_0$. Switching of the inverse signal 312' (CLK_B) also induces charge injection into the tail node $S_0$. The charge induced by switching of the inverse signal 312' is opposite to charge induced by switching of the clock signal 312, thereby providing a certain degree of charge compensation. In some embodiments, the DC voltage 904 and the switchable capacitor 902 are selected jointly to achieve charge compensation. In some embodiments, the switchable capacitor 902 has small capacitance that is less than a threshold capacitance. Third, the sense amplifier 300 that incorporates the modulation circuit 318 (e.g., FIGS. 9A and 9B) is configured to run at a high-speed (e.g., greater than a threshold rate). During the first clock cycle of the clock signal 312 (e.g., corresponding to "1"), the tail node $S_0$ is supposed to drop close to a supply voltage of the first power supply 320 (e.g., a ground voltage). The switchable capacitor 902 injects charge to the tail node $S_0$, which counteracts charge injection induced by clock switching and controls noses created at the tail node $S_0$.

Figure 10A:
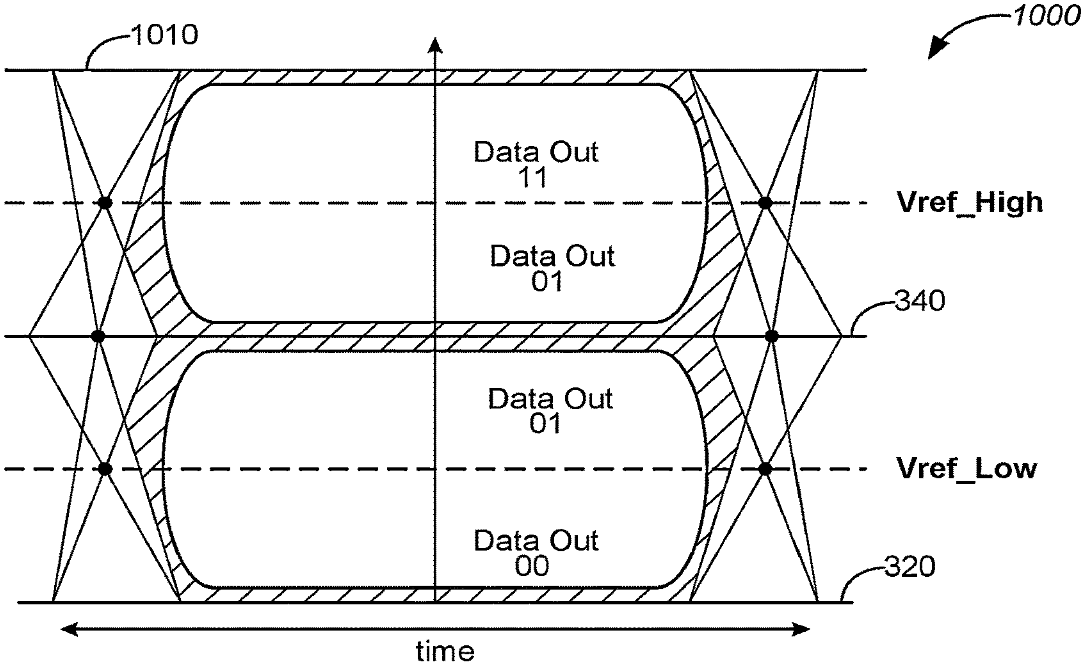
FIG. 10A is an eye diagram of an input signal of a pulse-amplitude modulation based data interface circuit, in accordance with some embodiments.
Figure 10B:
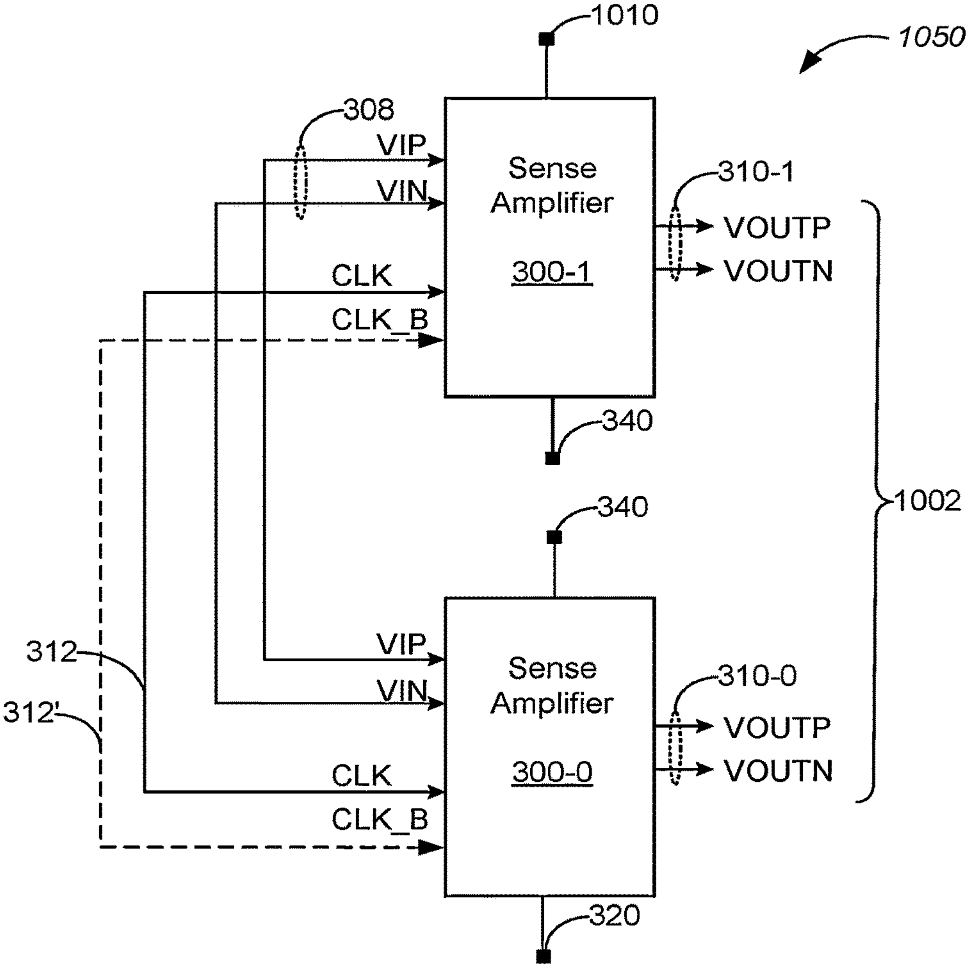
FIG. 10B is a schematic diagram of an example data interface circuit including two parallel sense amplifiers, in accordance with some embodiments.

FIG. 10A is an eye diagram 1000 of an input signal 308 of a pulse-amplitude modulation 3 (PAM-3) based data interface circuit 1050, in accordance with some embodiments, and FIG. 10B is a schematic diagram of an example data interface circuit 1050 including two parallel sense amplifiers 300-0 and 300-1, in accordance with some embodiments. A data sample is obtained from a differential input signal 308 during each clock cycle or each switching edge. If a PM3 scheme is applied, the data sample of the differential input signal 308 carries one of three digital data values, e.g., "00", "01", and "11", allowing the differential input signal 308 to carry 1.5 bits in each data sample. A PAM-3 based data interface circuit 150 receives a pair of input signals 308 (e.g., 308A and 308B) and a clock signal 312, and generates a data output 1002. The differential input signal 308 corresponds to a difference of the input signals 308A and 308B. The data output 1002 includes two differential output signals 310-0 and 310-1, representing two distinct data bits in each of the three digital data values, respectively.

Referring to FIG. 10A, in accordance with the PAM-3 scheme, the three digital data values of the differential output signal 310 are defined with respect to two reference voltages including a high reference voltage $V_{RH}$ and a low reference voltage $V_{RL}$. The data interface circuit 1050 is powered by the first power supply 320 (e.g., a negative supply VSS or a ground GND) and a third power supply 1010 (e.g., $V_D$H). In accordance with a determination that the differential input signal 308 is less than or equal to the low reference voltage $V_{RL}$, e.g., in a range of [0, $V_{RL}$], the data interface circuit 1050 generates a first data value (e.g., "00") as the data output 1002. In accordance with a determination that the differential input signal 308 is less than the low reference voltage $V_{RL}$ and greater than the high reference voltage $V_{RH}$, e.g., in a range of ($V_{RL}$, $V_{RH}$), the data interface circuit 1050 generates a second data value (e.g., "01") as the data output 1002. In accordance with a determination that the differential input signal 308 is greater than or equal to the high reference voltage $V_{RH}$, e.g., in a range of [$V_{RH}$, $V_{DH}$], the data interface circuit 1050 generates a third data value (e.g., "11") as the data output 1002.

Referring to FIG. 10B, in some embodiments, the data interface circuit 1050 includes two sense amplifiers 300-0 and 300-1 applied to generate a lower data bit and a higher data bit of the data output 1002, respectively. The lower data bit of the data output 1002 corresponds to a first differential output signal 310-0, the higher data bit of the data output 1002 corresponds to a second differential output signal 310-1. Each of the sense amplifier 300-0 and 300-1 includes a respective sense amplifier 300 shown in FIG. 3 or 4. The differential input signal 308 includes a pair of input signals 308 (e.g., 308A (VIP) and 308B (VIN)). A first sense amplifier 300-0 receives the differential input signal 308 and the clock signal 312 (CLK) and generates the first differential output signal 310-0 (e.g., VOUTP0 and VOUTN0). In some embodiments, the first sense amplifier 300-0 further receives an inverse signal 312' (CLK_B) to generate the output signal 310-0. A second sense amplifier 300-1 also receives the differential input signal 308 and the clock signal 312 (CLK) and generates a second differential output signal 310-1 (e.g., VOUTP1 and VOUTN1). In some embodiments, the second sense amplifier 300-1 further receives the inverse signal 312' (CLK_B) to generate the output signal 310-1. Stated another way, the first and second sense amplifier 300-0 and 300-1 are controlled by the same clock signal 312 to generate their respective differential output signals 310-0 and 310-1 based on the same input signals 308, respectively.

Further, in some embodiments, the third power supply 1010 has a supply voltage that is greater than supply voltages of the first power supply 320 and a second power supply 340. More specifically, the supply voltage of the second power supply 340 is between the two reference voltages $V_{RH}$ and $V_{RL}$. The first sense amplifier 300-0 is powered between the first power supply 320 and the second power supply 340. The differential output signal 310-0 of the first sense amplifier 300-0 varies between the supply voltages of the first and second power supplies 320 and 340 (e.g., corresponding to "0" and "1", respectively). The second sense amplifier 300-1 is powered between the second power supply 340 and the third power supply 1010 and is configured to convert the pair of input signals 308 to a pair of second output signals 310-1. The differential output signal 310-1 corresponds to a difference of the pair of second output signals 310-1. The differential output signal 310-1 varies between supply voltages of the second and third power supplies 340 and 1010 (e.g., corresponding to "0" and "1", respectively). By these means, in accordance with the PAM-3 scheme, the pair of input signals 308 is converted to one of three 2-bit (2*b*) data values based on the pair of first output signals 310-0 and the pair of second output signals 310-1.

The data interface circuit 1050 is powered between the first and third power supplies 320 and 1010, and the second power supply 340 is between the first and third power supplies 320 and 1010. In some embodiments, the first and third power supplies 320 and 1010 are known, and the second power supply 340 is determined based on the reference voltages $V_{RH}$ and $V_{RL}$. The first sense amplifier 300-0 is powered between the first power supply 320 and the second power supply 340. A pair of load transistors 302 of the first sense amplifier 300-0 is coupled to the second power supply 340. The second sense amplifier 300-1 is powered between the second power supply 340 and the third power supply 1010. A pair of load transistors 302 of the second sense amplifier 300-1 is coupled to the third power supply 1010, and a first current path 306 of the second sense amplifier 300-1 is coupled to the second power supply 340. The clock signal 312 and corresponding inverse signal 312' vary between the supply voltages of the first and third power supplies 320 and 1010. As such, the clock signal 312 varies between two clock voltages, and at least one of the two clock voltages is different from the supply voltages powering each sense amplifier 300-0 or 300-1.

Pulse amplitude modulation is not limited to the above PAM-3 scheme, and may be any of PAM-4, PAM-5, . . . , PAM-i, where i is a positive integer equal to or greater than 3. A PAM-i scheme corresponds to (i−1) eyes on a corresponding eye diagram, and each data sample of the differential input signal 308 carries one of i digital data values as defined by the corresponding eye diagram. In some embodiments, (i−2) power supply levels are inserted between supply voltages of two predefined power supplies to form an ordered sequence of power supplies arranged based on magnitudes of the corresponding supply voltages. A distinct sense amplifier 300 is powered between every two immediately adjacent power supplies in the ordered sequence of power supplies. For PAM-3, the positive integer i is equal to 3, and 1 power supply level (e.g., the second power supply 340) is inserted between the first power supply 320 and the third power supply 1010. A first sense amplifier 300-0 is powered between the power supplies 320 and 340, and a second sense amplifier 300-1 is powered between the power supplies 340 and 1010.

FIG. 11 is a flow diagram of an example method 1100 for amplifying input signals in a high-speed wired communication link, in accordance with some embodiments. A sense amplifier 300 receives (1102) a pair of input signals 308 by a pair of input transistors 304. The pair of input transistors 304 is coupled (1104) to a first current path 306 via a tail node, and a pair of load transistors 302 is cross-coupled (1106) to each other and coupled to the pair of input transistors 304. The sense amplifier 300 controls (1108) a first current path 306 using a clock signal 312 to couple the tail node $S_0$ to a first power supply 320 during a first duty cycle of the clock signal 312, and generates (1110) a pair of output signals 310 from the pair of input signals 308 during the first duty cycle of the clock signal 312. A modulation circuit 318 includes a second current path 702 and is applied in the sense amplifier 300. The sense amplifier 300 (FIG. 7) enables (1112) the second current path 702 between the tail node $S_0$ and a first power supply 320 independently of switching of the clock signal 312.

In some embodiments (FIG. 7), the second current path 702 further includes (1114) a bypass transistor 704 coupled between the tail node $S_0$ and the first power supply 320. The bypass transistor 704 receives a gate enable signal 706 and is turned on to keep the tail node $S_0$ electrically coupled to the first power supply 320, independently of switching of the clock signal 312. Further, in some embodiments, the first current path 306 further includes a control transistor 316 having a gate coupled to the clock signal 312. The control transistor 316 is coupled between the tail node $S_0$ and the first power supply 320 and is in parallel with the bypass transistor 704, and the size of the control transistor 316 is greater than the size of the bypass transistor 704.

In some embodiments (FIG. 9), a switchable capacitor 902 is coupled (1116) between the tail node $S_0$ and the first power supply 320 according to a first polarity during the first duty cycle of the clock signal 312, and coupled (1118) between a DC voltage 904 and the first power supply 320 according to a second polarity during a second duty cycle of the clock signal 312. The first polarity is opposite to the second polarity, and the second duty cycle immediately follows and is complementary to the first duty cycle. In some embodiments, the switchable capacitor 902 includes a first electrode and a second electrode. During the first duty cycle of the clock signal 312, the first electrode is electrically coupled to the first power supply 320, and the second electrode is electrically coupled to the tail node $S_0$. During the second duty cycle of the clock signal 312, the first electrode is electrically coupled to the DC voltage 904, and the second electrode is electrically coupled to the first power supply 320. Further, in some embodiments, a first switch is coupled between a first electrode of the switchable capacitor 902 and the first power supply 320, and a second switch is coupled between a second electrode of the switchable capacitor 902 and the tail node $S_0$. A third switch is coupled between the first electrode and the DC voltage 904, and a fourth switch is coupled between the second electrode and the first power supply 320. The first switch and the second switch are controlled by an inverse signal that is inverse to the clock signal 312 to charge the switchable capacitor 902 during the first duty cycle according to the first polarity. The third switch and the fourth switch are controlled by the clock signal 312 to charge the switchable capacitor 902 during the second duty cycle according to the second polarity. In some embodiments, the DC voltage 904 is adjusted based on a noise level of the pair of output signals 310.

In some embodiments, each of the pair of input signals 308 is configured to vary between a first input voltage level and a second input voltage level. Each of the pair of output signals 310 is configured to vary between a first supply voltage of the first power supply 320 and a second supply voltage of a second power supply 340 distinct from the first power supply 320. At least one of the first input voltage level and the second input voltage level is distinct from both the first supply voltage and the second supply voltage. The sense amplifier 300 is also called a level shifter.

In some embodiments, the tail node $S_0$ is coupled to a plurality of parasitic capacitors including one or more of a pair of gate-to-source parasitic capacitors formed between the tail node $S_0$ and gates of the pair of input transistors 304, a gate-to-drain parasitic capacitor formed between the tail node $S_0$ and a gate of a control transistor 316 coupled in the first current path 306, and a supply parasitic capacitor formed between the tail node $S_0$ and the first power supply 320.

In some embodiments, a pair of latch transistors 402 (FIG. 4) is applied. Each latch transistor is coupled in series between a respective first load transistor and a respective input transistor, and forms a CMOS inverter with the respective load transistor.

In some embodiments associated with pulse amplitude modulation (PAM), the pair of load transistors 302 is coupled to a second power supply 340 distinct from the first power supply 320, and the clock signal 312 varies between two clock voltages. At least one of the two clock voltages is distinct from supply voltages of the first and second power supplies.

In some embodiments, the pair of load transistors 302 is coupled to a second power supply 340 distinct from the first power supply 320, and the clock signal 312 varies between supply voltages of the first power supply 320 and the second power supply 340.

In some embodiments, the clock signal 312 has a clock frequency that is greater than a threshold frequency (e.g., 2 GHz).

In some embodiments, the sense amplifier 300 includes a first sense amplifier 300-0 powered between the first power supply 320 and a second power supply 340, and the pair of output signals 310 includes a pair of first output signals 310-0. A second sense amplifier 300-1 (FIG. 10B) is powered between the second power supply 340 and a third power supply 1010. The second sense amplifier 300-1 converts the pair of input signals 308 to a pair of second output signals 310-1. In accordance with a PAM scheme, the pair of input signals 308 is converted to one of three or more data values based on the pair of first output signals 310-0 and the pair of second output signals 310-1.

In some embodiments, a pair of precharge transistors 314 precharges the pair of output signals 310 to a supply voltage of the second power supply 340. Each precharge transistor is coupled to a respective load transistor and coupled between a second power supply 340 and a respective output of the sense amplifier 300. Further, in some embodiments, the pair of input transistors 304 is a pair of N-type transistors, and the pair of load transistors 302 and the pair of precharge transistors 314 are P-type transistors. The supply voltage of the second power supply 340 is higher than that of the first power supply 320. Alternatively, in some embodiments, the pair of input transistors 304 is a pair of P-type transistors, and the pair of load transistors 302 and the pair of precharge transistors 314 are N-type transistors. The supply voltage of the second power supply 340 is lower than that of the first power supply 320.

FIG. 12 is a flow diagram of an example method 1200 for providing a sense amplifier 300 in which a modulation circuit 318 is applied to control injection current noise, in accordance with some embodiments. In accordance with the method 1200, a pair of load transistors 302 is provided (1202), and a pair of input transistors 304 is provided (1204). The load transistors 302 are cross-coupled to each other. The pair of input transistors 304 is coupled to the pair of load transistors 302 and configured (1206) to receive a pair of input signals 308 and enable generation of a pair of output signals 310 from the pair of input signals 308 during a first duty cycle of a clock signal 312. In accordance with the method 1200, a first current path 306 is provided (1208). The first current path 306 is coupled to the pair of input transistors 304 via a tail node $S_0$. The first current path 306 is controlled (1210) by the clock signal 312 to couple the tail node $S_0$ to a first power supply 320 and enable generation of the pair of output signals 310 during the first duty cycle of the clock signal 312. In accordance with the method 1200, a second current path 702 is provided (1212). The second current path 702 is coupled (1212) to the tail node $S_0$ and is configured to electrically couple (1214) the tail node $S_0$ to the first power supply 320, independently of switching of the clock signal 312.

In some embodiments, the second current path 702 further includes (1216) a bypass transistor 704 coupled between the tail node $S_0$ and the first power supply 320. The bypass transistor 704 receives a gate enable signal 706 and is turned on to keep the tail node $S_0$ electrically coupled to the first power supply 320, independently of switching of the clock signal 312. Further, in some embodiments, the first current path 306 further includes a control transistor 316 having a gate coupled to the clock signal 312. The control transistor 316 is coupled between the tail node $S_0$ and the first power supply 320 and in parallel with the bypass transistor 704, and the size of the control transistor 316 is greater than the size of the bypass transistor 704.

In some embodiments, in accordance with the method 1200, a switchable capacitor 902 is provided (1218). The switchable capacitor 902 is configured: (1) to be coupled between the tail node $S_0$ and the first power supply 320 according to a first polarity during the first duty cycle of the clock signal 312 and (2) to be coupled between a DC voltage 904 and the first power supply 320 according to a second polarity during a second duty cycle of the clock signal 312. The first polarity is opposite (1220) to the second polarity, and the second duty cycle immediately follows and is complementary to the first duty cycle. Further, in some embodiments, the switchable capacitor 902 includes a first electrode and a second electrode. During the first duty cycle of the clock signal 312, the first electrode is electrically coupled to the first power supply 320, and the second electrode is electrically coupled to the tail node $S_0$. During the second duty cycle of the clock signal 312, the first electrode is electrically coupled to the DC voltage 904, and the second electrode is electrically coupled to the first power supply 320. In some embodiments, a plurality of switches is provided. A first switch is coupled between a first electrode of the switchable capacitor 902 and the first power supply 320, and a second switch is coupled between a second electrode of the switchable capacitor 902 and the tail node $S_0$. A third switch is coupled between the first electrode and the DC voltage 904, and a fourth switch is coupled between the second electrode and the first power supply 320. The first switch and the second switch are controlled by an inverse signal that is inverse to the clock signal 312 to charge the switchable capacitor 902 during the first duty cycle according to the first polarity. The third switch and the fourth switch are controlled by the clock signal 312 to charge the switchable capacitor 902 during the second duty cycle according to the second polarity. In some embodiments, the DC voltage 904 is provided to be adjusted based on the noise level of the pair of output signals 310.

In some embodiments, in accordance with the method 1200, a pair of latch transistors 402 (FIG. 4) is provided (1222). Each latch transistor is coupled in series between a respective first load transistor and a respective input transistor, and forms a complementary metal-oxide semiconductor (CMOS) inverter with the respective load transistor.

In some embodiments, the sense amplifier 300 includes a first sense amplifier 300-0 powered between the first power supply 320 and a second power supply 340, and the pair of output signals 310 includes a pair of first output signals 310-0. In accordance with the method 1200, a second sense amplifier 300-1 (FIG. 10B) is provided. The second sense amplifier 300-1 is powered between the second power supply 340 and a third power supply and configured to convert the pair of input signals 308 to a pair of second output signals 310-1. In accordance with a PAM scheme, the pair of input signals 308 is converted to one of three or more data values based on the pair of first output signals 310-0 and the pair of second output signals 310-1.

In some embodiments, in accordance with the method 1200, a pair of precharge transistors 314 is provided (1224). Each precharge transistor is coupled to a respective load transistor and coupled between a second power supply 340 and a respective output of the sense amplifier 300. The pair of precharge transistors 314 is configured to precharge the pair of output signals 310 to a supply voltage of the second power supply 340.

In some embodiments, the methods 1100 and 1200 are governed by instructions that are stored in a non-transitory computer readable storage medium and that are executed by one or more processors (e.g., a controller) of an electronic device (e.g., a driver device). Each of the operations shown in FIGS. 11 and 12 may correspond to instructions stored in memory or on a non-transitory computer readable storage medium. The computer readable storage medium may include a magnetic or optical disk storage device, a solid-state storage device such as Flash memory, or other non-volatile memory device or devices. The instructions stored on the computer readable storage medium may include one or more of: source code, assembly language code, object code, or other instruction format that is interpreted by one or more processors. Some operations in methods 1100 and 1200 may be combined and/or the order of some operations may be changed.

The particular order in which the operations in FIGS. 11 and 12 have been described are merely exemplary and are not intended to indicate that the described order is the only order in which the operations could be performed. One of ordinary skill in the art would recognize various ways to control charge injection noise of a sense amplifier as described herein. Additionally, it should be noted that details of other processes and structures described above with respect to FIGS. 1-10B are also applicable in an analogous manner to the methods 1100 and 1200 described above with respect to FIGS. 11 and 12. For brevity, these details are not repeated here.

It will also be understood that, although the terms first, second, etc. are, in some instances, used herein to describe various elements, these elements should not be limited by these terms. These terms are only used to distinguish one element from another. For example, a first electronic device can be termed a second electronic device, and, similarly, a second electronic device can be termed a first electronic device, without departing from the scope of the various described embodiments. The first electronic device and the second electronic device are both electronic devices, but they are not the same electronic device.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the term "if" can mean "when" or "upon" or "in response to determining" or "in response to detecting" or "in accordance with a determination that," depending on the context. Similarly, the phrase "if it is determined" or "if [a stated condition or event] is detected" can mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software, or any combination thereof.

The above description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electronic device, comprising:

a sense amplifier further including:

a pair of load transistors cross-coupled to each other;

a pair of input transistors coupled to the pair of load transistors, the pair of input transistors configured to receive a pair of input signals and enable generation of a pair of output signals from the pair of input signals during a first duty cycle of a clock signal;

a first current path coupled to the pair of input transistors via a tail node, wherein the first current path is controlled by the clock signal to couple the tail node to a first power supply and enable generation of the pair of output signals during the first duty cycle of the clock signal; and a second current path coupled between the tail node and the first power supply, wherein the second current path is configured to guide a modulation current from the tail node to the first power supply, independently of switching of the clock signal.

2. The electronic device of claim 1, wherein the second current path further comprises a bypass transistor coupled between the tail node and the first power supply, and wherein the bypass transistor is configured to receive a gate enable signal and to be turned on to keep the tail node electrically coupled to the first power supply, independently of switching of the clock signal.

3. The electronic device of claim 2, wherein the first current path further comprises a control transistor having a gate coupled to the clock signal, and wherein the control transistor is coupled between the tail node and the first power supply and in parallel with the bypass transistor, and a size of the control transistor is greater than a size of the bypass transistor.

4. The electronic device of claim 1, further comprising a switchable capacitor configured: (1) to be coupled between the tail node and the first power supply according to a first polarity during the first duty cycle of the clock signal and (2) to be coupled between a DC voltage and the first power supply according to a second polarity during a second duty cycle of the clock signal;

wherein the first polarity is opposite to the second polarity, and the second duty cycle immediately follows and is complementary to the first duty cycle.

5. The electronic device of claim 4, wherein:

the switchable capacitor includes a first electrode and a second electrode;

during the first duty cycle of the clock signal, the first electrode is electrically coupled to the first power supply, and the second electrode is electrically coupled to the tail node; and during the second duty cycle of the clock signal, the first electrode is electrically coupled to the DC voltage, and the second electrode is electrically coupled to the first power supply.

6. The electronic device of claim 4, wherein:

a first switch is coupled between a first electrode of the switchable capacitor and the first power supply, and a second switch is coupled between a second electrode of the switchable capacitor and the tail node; and a third switch is coupled between the first electrode and the DC voltage, and a fourth switch is coupled between the second electrode and the first power supply;

the first switch and the second switch are controlled by an inverse signal that is inverse to the clock signal to charge the switchable capacitor during the first duty cycle according to the first polarity; and the third switch and the fourth switch are controlled by the clock signal to charge the switchable capacitor during the second duty cycle according to the second polarity.

7. The electronic device of claim 4, wherein the DC voltage is configured to be adjusted based on a noise level of the pair of output signals.

8. The electronic device of claim 1, wherein:

each of the pair of input signals is configured to vary between a first input voltage level and a second input voltage level;

each of the pair of output signals is configured to vary between a first supply voltage of the first power supply and a second supply voltage of a second power supply distinct from the first power supply; and at least one of the first input voltage level and the second input voltage level is distinct from both the first supply voltage and the second supply voltage.

9. The electronic device of claim 1, wherein the tail node is coupled to a plurality of parasitic capacitors including one or more of:

a pair of gate-to-source parasitic capacitors formed between the tail node and gates of the pair of input transistors;

a gate-to-drain parasitic capacitor formed between the tail node and a gate of a control transistor coupled in the first current path; and a supply parasitic capacitor formed between the tail node and the first power supply.

10. The electronic device of claim 1, further comprising:

a pair of latch transistors, wherein each latch transistor is coupled in series between a respective first load transistor and a respective input transistor and forms a complementary metal-oxide semiconductor (CMOS) inverter with the respective first load transistor.

11. The electronic device of claim 1, wherein (i) the pair of load transistors is coupled to a second power supply distinct from the first power supply, (ii) the clock signal varies between two clock voltages, and (iii) at least one of the two clock voltages is distinct from supply voltages of the first and second power supplies.

12. The electronic device of claim 1, wherein the pair of load transistors is coupled to a second power supply distinct from the first power supply, and the clock signal varies between supply voltages of the first power supply and the second power supply.

13. The electronic device of claim 1, wherein the clock signal has a clock frequency that is greater than a threshold frequency.

14. The electronic device of claim 1, wherein (i) the sense amplifier includes a first sense amplifier powered between the first power supply and a second power supply, (ii) the pair of output signals includes a pair of first output signals, and (iii) the electronic device further comprises:

a second sense amplifier powered between the second power supply and a third power supply, the second sense amplifier configured to convert the pair of input signals to a pair of second output signals;

wherein, in accordance with a pulsed amplitude modulation (PAM) scheme, the pair of input signals is converted to one of three or more data values based on the pair of first output signals and the pair of second output signals.

15. The electronic device of claim 1, further comprising:

a pair of precharge transistors, each precharge transistor coupled to a respective load transistor and coupled between a second power supply and a respective output of the sense amplifier, the pair of precharge transistors configured to precharge the pair of output signals to a supply voltage of the second power supply.

16. The electronic device of claim 15 wherein (i) the pair of input transistors is a pair of N-type transistors, (ii) the pair of load transistors and the pair of precharge transistors are P-type transistors, and (iii) the supply voltage of the second power supply is higher than that of the first power supply.

17. The electronic device of claim 15, wherein (i) the pair of input transistors is a pair of P-type transistors, (ii) the pair of load transistors and the pair of precharge transistors are N-type transistors, and (iii) the supply voltage of the second power supply is lower than that of the first power supply.

18. A sense amplifier, comprising:

a pair of load transistors that are cross-coupled to each other;

a pair of input transistors coupled to the pair of load transistors, the pair of input transistors configured to receive a pair of input signals and enable generation of a pair of output signals from the pair of input signals during a first duty cycle of a clock signal;

a first current path coupled to the pair of input transistors via a tail node, wherein the first current path is controlled by the clock signal to couple the tail node to a first power supply and enable generation of the pair of output signals during the first duty cycle of the clock signal; and a second current path coupled to the tail node and the first power supply, wherein the second current path is configured to guide a modulation current from the tail node to the first power supply, independently of switching of the clock signal.

19. The sense amplifier of claim 18, wherein the second current path further comprises a bypass transistor coupled between the tail node and the first power supply, and wherein the bypass transistor is configured to receive a gate enable signal and to be turned on to keep the tail node electrically coupled to the first power supply, independently of switching of the clock signal.

20. A method for amplifying input signals in a high-speed wired communication link, comprising:

receiving a pair of input signals by a pair of input transistors, wherein the pair of input transistors is coupled to a first current path via a tail node, and a pair of load transistors is cross-coupled to each other and coupled to the pair of input transistors;

controlling a first current path using a clock signal to couple the tail node to a first power supply during a first duty cycle of the clock signal;

generating a pair of output signals from the pair of input signals during the first duty cycle of the clock signal; and enabling a second current path coupled between the tail node and a first power supply to guide a modulation current from the tail node to the first power supply, independently of switching of the clock signal.

* * * * *